US012119074B2

(12) United States Patent
Duryea

(10) Patent No.: US 12,119,074 B2
(45) Date of Patent: Oct. 15, 2024

(54) DATA CORRECTION OF REDUNDANT DATA STORAGE

(71) Applicant: TEXAS INSTRUMENTS INCORPORATED, Dallas, TX (US)

(72) Inventor: Timothy Duryea, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 211 days.

(21) Appl. No.: 17/955,439

(22) Filed: Sep. 28, 2022

(65) Prior Publication Data

US 2024/0105276 A1 Mar. 28, 2024

(51) Int. Cl.
*G11C 29/52* (2006.01)
*G11C 7/10* (2006.01)
*G11C 7/22* (2006.01)

(52) U.S. Cl.
CPC ............ *G11C 29/52* (2013.01); *G11C 7/1039* (2013.01); *G11C 7/22* (2013.01)

(58) Field of Classification Search
CPC ............ G11C 29/52; G11C 7/139; G11C 7/22
See application file for complete search history.

(56) References Cited

U.S. PATENT DOCUMENTS

| 5,457,702 | A | * | 10/1995 | Williams, III | ........ H03M 13/43 714/766 |
| 8,975,916 | B1 | | 3/2015 | Yarlagadda | |
| 2013/0346809 | A1 | * | 12/2013 | Kazi | ................... G06F 11/1068 714/48 |
| 2022/0245023 | A1 | | 8/2022 | Lu | |
| 2022/0276924 | A1 | | 9/2022 | Mills | |
| 2022/0276928 | A1 | | 9/2022 | Hu | |
| 2022/0283898 | A1 | | 9/2022 | Lea | |

OTHER PUBLICATIONS

International Search Report mailed Jan. 23, 2024.

* cited by examiner

*Primary Examiner* — Han Yang
(74) *Attorney, Agent, or Firm* — Charles F. Koch; Frank D. Cimino

(57) ABSTRACT

In one example, an apparatus comprises first, second and third memory devices, an error detection circuit, and an error correction circuit. The error detection circuit is configured to detect a mismatch among data stored at the first, second, and third memory devices, and responsive to detecting the mismatch, provide a correction signal representing a majority state of the data. The error correction circuit is configured to write the majority state of the data into at least one of the first, second, or third memory devices responsive to the correction signal.

20 Claims, 16 Drawing Sheets

DATA CORRECTION OF REDUNDANT DATA STORAGE

BACKGROUND

An electronic system often includes a memory, such as random access memory (RAM) and sequential logic circuits, to store data to support various operations of the system. Electronic systems operating in a high radiation environment, such as systems for aerospace and defense applications, can be susceptible to transient upset events. In a transient upset event, high energy ionizing particles (e.g., ions, electrons, and photons) can strike a circuit component of the system and create free charge by ionization. The free charge can cause a state change in the circuit component, such as the memory. The free charge can corrupt the data stored in the memory, or cause the electronic system to write erroneous data into the memory. Both can introduce error to the operation of the electronic system.

SUMMARY

An apparatus comprises first, second, and third memory devices, an error detection circuit, and an error detection circuit. The first memory device has a first data input and a first data output. The second memory device has a second data input and a second data output. The third memory device has a third data input and a third data output. The error detection circuit has a first detection input, a second detection input, a third detection input, and a detection output. The first detection input is coupled to the first data output. The second detection input is coupled to the second data output. The third detection input is coupled to the third data output. The error detection circuit is configured to: detect a mismatch among data stored at the first, second, and third memory devices; and responsive to detecting the mismatch, provide a correction signal at the detection output, the correction signal representing a majority state of the data. The error correction circuit having a correction input, a first correction output, a second correction output, and a third correction output, the correction input coupled to the detection output, the first correction output coupled to the first data input, the second correction output coupled to the second data input, the third correction output coupled to the third data input, and the error correction circuit configured to write the majority state of the data into at least one of the first, second, or third memory devices.

An apparatus comprises first, second, and third memory devices, an instruction memory, and a processor. The first memory device is configured to store a first copy of first data. The second memory device is configured to store a second copy of the first data. The third memory device is configured to store a third copy of the first data. The instruction memory is configured to store a set of instructions. The processor is configured to execute the set of instructions to: detect a mismatch between the first, second, and third copies of the first data stored at the respective first, second, and third memory devices; generate a correction signal representing an uncorrupted state of the first data; determine whether second data is received; responsive to determining that the second data is received, store copies of the second data at the first, second, and third memory devices; and responsive to determining that the second data is not received, provide the correction signal to at least one of the first, second, or third memory devices to write the uncorrupted state of the first data into at least one of the first, second, or third memory devices.

DETAILED DESCRIPTION

Figure 1:
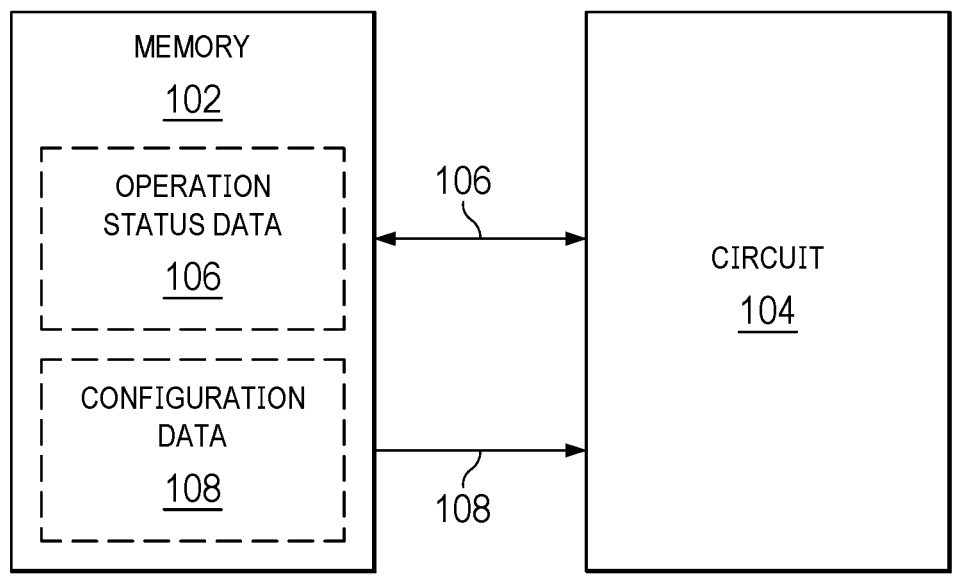
FIG. 1 is a schematic diagram of an example system including a memory.

FIG. 1 is a schematic diagram of an example system 100 including a memory 102 and a circuit 104. Memory 102 can include a memory device, such as a static random access memory (SRAM), a dynamic random access memory (DRAM), a magnetoresistive RAM, and a flash memory. Memory 102 can also include a sequential logic device, such as a latch (e.g., R-S latch), and a flip-flop.

Memory 102 can store various types of data to support the operation of circuit 104. For example, memory 102 can store operation status data 106. The operation status data 106 can represent a current state of operation of circuit 104. Circuit 104 may read memory 102 to access the current state, and operate based on the current state. Responsive to the state machine transitioning to a new state, circuit 104 can also update the operation status data 106 in memory 102 to reflect the new state. As another example, memory 102 can store configuration data 108. Configuration data 108 can include settings and/or programming information, such as operation frequency of circuit 104, power limit of circuit 104, and thresholds/conditions for different operation modes of circuit 104. Circuit 104 can read memory 102 to access configuration data 108, and operate based on the settings and/or programming information included in configuration data 108.

Figure 2:
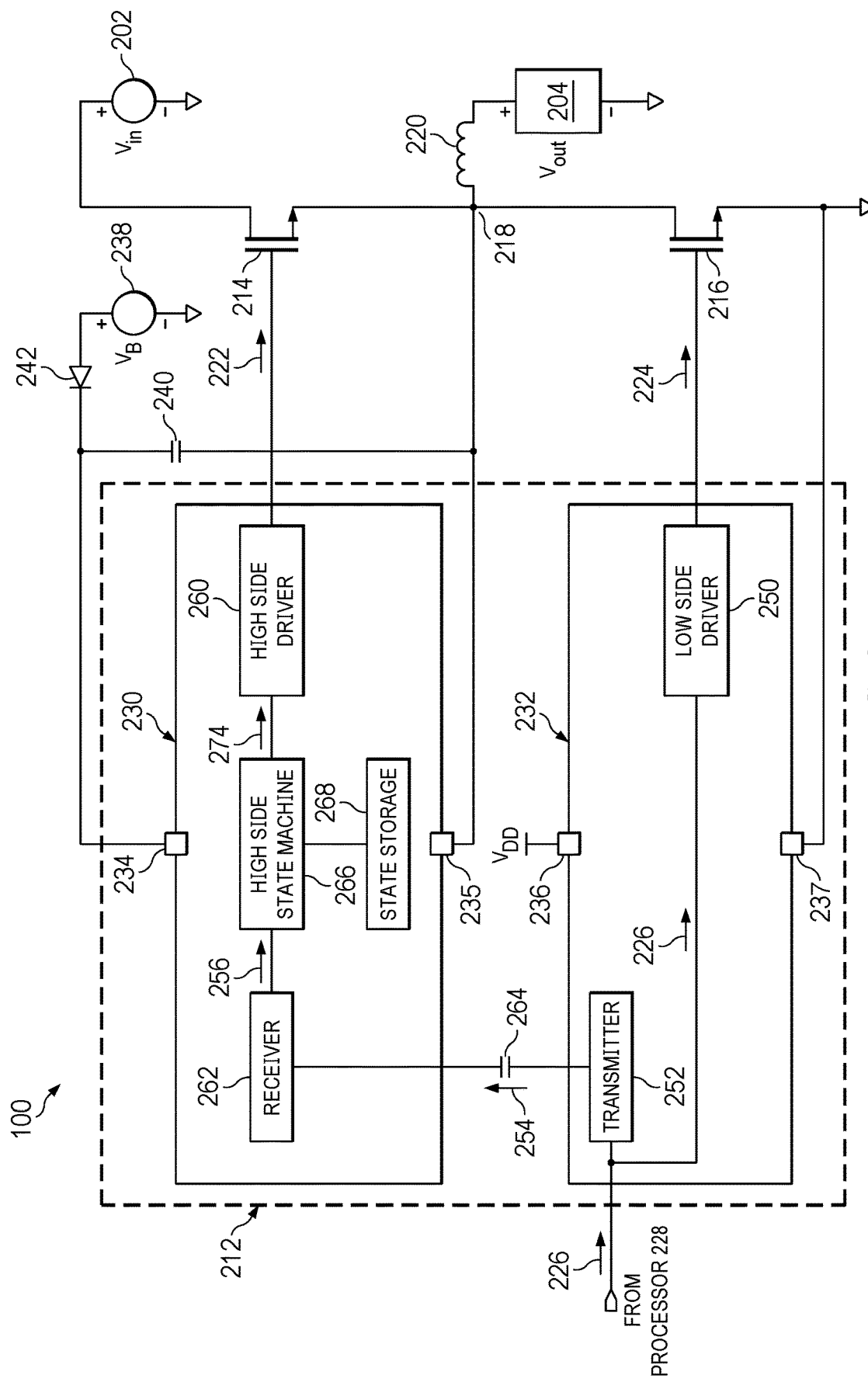
FIG. 2 is a schematic diagram of another example system including a memory.

FIG. 2 illustrates an example of system 100. In FIG. 2, system 100 can be a power converter system to transfer power from a power source 202 to a load 204. System 100 can include a control circuit 212, a high side switch 214, and a low side switch 216. High side switch 214 can be coupled between power source 202 and a switching node 218, and low side switch 216 can be coupled between switching node 218 and a ground terminal. An energy storage element 220 (e.g., an inductor) can be coupled between switching node 218 and load 204.

Power source 202 can provide an input voltage $V_{in}$. Control circuit 212 can provide high side control signal 222 to enable/disable high side switch 214, and low side control signal 224 to enable/disable low side switch 216, to provide an output voltage $V_{out}$ across load 204. Through controlling the respective on-times of high side switch 214 and low side switch 216, control circuit 212 can set a ratio between input voltage $V_{in}$ and output voltage $V_{out}$. Control circuit 212 can generate high side control signal 222 and low side control signal 224 based on a control signal 226 from a processor 228 (not shown in FIG. 2). For example, responsive to control signal 226 having an asserted state, control circuit 122 can generate low side control signal 224 having an asserted state to enable low side switch 216 and high side control signal 222 having a deasserted state to disable high side switch 214. Also, responsive control signal 226 having a deasserted state, control circuit 122 can generate low side control signal 224 having a deasserted state to disable low side switch 216 and high side control signal 222 having an asserted state to enable high side switch 214.

In some examples, system 100 can be a step-down converter where $V_{in}$ is higher than $V_{out}$. $V_{in}$ can be substantially higher than $V_{out}$. For example, yin can be around 100 Volts (V), and $V_{out}$ can be around 10 V. High side control signal 222 can have a voltage range between $V_{in}+V_B$ and a ground voltage (0 V), and low side control signal 224 can have a voltage range between $V_{DD}$ and ground voltage (0 V), with $V_{DD}$ higher than $V_{in}$. High side switch 214 can be enabled with high side control signal 222 at $V_{in}+V_B$, and can be disabled with high side control signal 222 at 0 V. Also, low side switch 216 can be enabled with low side control signal 224 at $V_{in}$, and can be disabled with low side control signal 222 at 0 V.

Control circuit 212 can include a high side driver circuit 230 to provide high side control signal 222, and a low side driver circuit 232 to provide low side control signal 224. High side driver circuit 230 can have a positive supply terminal 234 and a negative supply terminal 235, and low side driver circuit can have a positive supply terminal 236 and a negative supply terminal 237. Current can flow from positive supply terminal 234 to supply power to high side driver circuit 230, and flow out of negative supply terminal 235. Also, current can flow from positive supply terminal 236 to supply power to high side driver circuit 232, and flow out of negative supply terminal 237.

Also, system 100 can include a voltage source 238 to supply the $V_B$ voltage, a capacitor 240 coupled between positive supply terminal 234 and negative supply terminal 235 of high side driver circuit 230, and a diode 242 coupled between voltage source 238 and positive supply terminal 234. Voltage source 238, capacitor 240, and diode 242 can provide a bootstrap circuit. When low side switch 224 is enabled, the voltage of switching node 218 (and negative supply terminal 235) can drop to ground (0 V), and voltage source 238 can charge capacitor 240 via diode 242 so that the voltage across capacitor 240 becomes $V_B$. When high side switch 214 is enabled, the voltage of switching node 218 (and negative supply terminal 235) can rise to $V_{in}$, and the voltage at positive supply terminal 234 can become $V_{in}+V_B$, and diode 242 can disconnect positive supply terminal 234 and capacitor 240 from voltage source 238.

This allows high side driver circuit 230 to provide high side control signal 222 having the voltage of $V_{in}+V_B$ to fully enable high side switch 214, while maintaining the voltage difference between positive supply terminal 234 and negative supply terminal 235 at $V_B$ to reduce the voltage stress on the transistor devices of high side driver circuit 230. System 100 can also include a power supply, such as a voltage regulator (not shown in the figures) coupled to positive supply terminal 236 of low side driver circuit 232 to provide the $V_{dd}$ voltage, and negative supply terminal 237 of low side driver circuit 232 can be coupled to ground.

Low side driver circuit 232 can include a low side driver 250 to receive control signal 226 and generate low side control signal 224 based on control signal 226. Low side driver circuit 232 can also include a transmitter circuit 252 to transmit a signal 254 representing control signal 226 to high side driver circuit 230. High side driver circuit 230 can include a high side driver circuit 260 and a receiver circuit 262. Receiver circuit 262 can receive signal 254 from transmitter circuit 252. High side driver circuit 260 can generate high side control signal 222 based on signal 254.

High side driver circuit 230 can operate in a high voltage domain of $V_{in}+V_B$, and low side driver circuit 232 can operate in a low voltage domain of $V_{DD}$. In some examples, high side driver circuit 230 and low side driver circuit 232 can be in different chips within the integrated circuit package. Also, due to high side driver circuit 230 and low side driver circuit 232 operating in different power domains, they can be galvanically isolated from each other to prevent exposing low side driver circuit 232 to high voltage stress. In some examples, control circuit 212 can include a capacitor 264 coupled between transmitter circuit 252 and receiver circuit 262 to provide the galvanical isolation. Capacitor 264 can be configured as an alternating current (AC) capacitor which blocks the transmission of the direct current (DC) component of signal 254 and allows the transmission of the transition edges of signal 254. Receiver 262 can provide a transition indication signal 256 that indicates detection of a transition edge.

High side driver circuit 230 can also include a high side state machine 266 and a state storage 268. State storage 268 can be memory 102 of FIG. 1 and can include a RAM or a sequential logic circuit. High side state machine 266 can provide a state signal 274 to high side driver 260 to set a state of high side control signal 222. High side driver circuit 230 can also store a current state of high side control signal 222 in state storage 268 and, responsive to receiving transition indication signal 256, provide state signal 274 to toggle the state of the high side control signal. High side driver circuit 230 can then toggle the stored state in state storage 268. The data stored in state storage 268 can be an example of operation status data 106 of FIG. 1.

Figure 3:
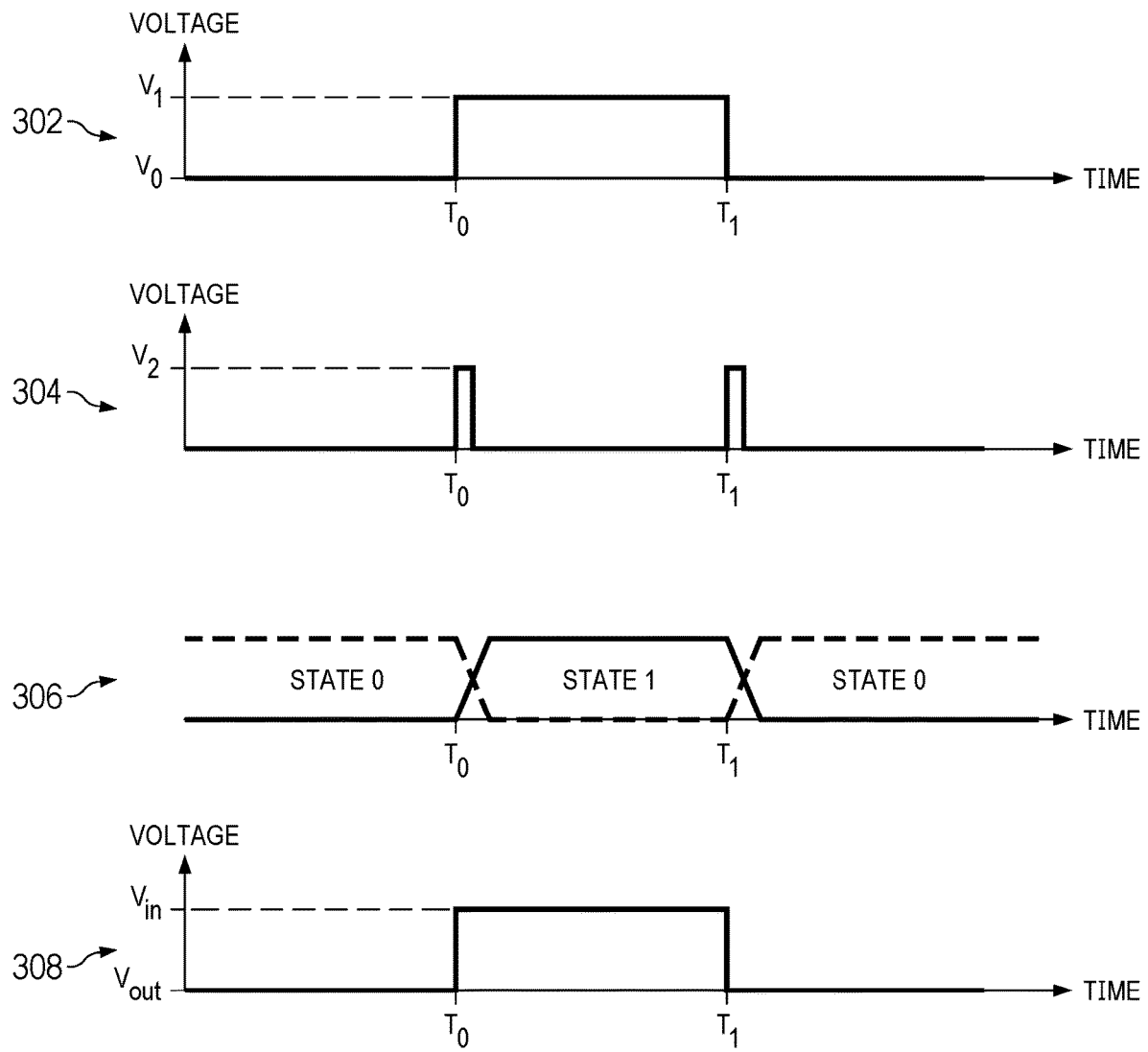
FIG. 3 illustrates graphs of example operations of a component of the example system of FIG. 2.

FIG. 3 illustrates graphs of example operations of high side driver circuit 230. Graph 302 illustrates example variations of signal 254 with time, graph 304 illustrates example variations of transition indication signal 256 with time, graph 306 illustrates example variations of state data stored in state storage 268, and graph 308 illustrates example variations of high side control signal 222 with time. Referring to graphs 302 through 306, before time $T_0$, signal 254 (and control signal 226) can be in a deasserted state and have a voltage of $V_0$, and transition indication signal 256 can also be in an inactive state. Responsive to transition indication signal 256 being in the inactive state, high side state machine 266 can maintain the current state stored in state storage 268. Before time $T_0$, state storage 268 can store a first state (e.g., state 0). Responsive to state storage 268 storing the first state, high side driver circuit 230 can set high side control signal 222 to the deasserted state (e.g., having the voltage of $V_{out}$) to disable high side switch 214.

At time $T_0$, signal 254 (and control signal 226) transitions from the deasserted state to an asserted state and have a voltage of $V_1$. Receiver 262 can detect the transition and generate a pulse at $T_0$ for transition indication signal 256. Responsive to detecting the pulse (and transition indication signal 256 being active), high side state machine 266 can toggle the stored state in state storage 268. For example, high side state machine 266 can store a second state (e.g., state 1) in state storage 268. Responsive to state storage 268 storing the second state, high side driver circuit 230 can set high side control signal 222 to the asserted state (e.g., having the voltage of $V_{in}+V_B$) to enable high side switch 214. Between $T_1$ and $T_2$ signal 254 remains in the asserted state. Transition indication signal 256 can be in the inactive state, state storage 268 can continue storing the second state, and high side control signal 222 can remain in the asserted state.

At time $T_1$, signal 254 (and control signal 226) transitions from the asserted state back to the deasserted state and have a voltage of $V_2$. Receiver 262 can detect the transition and generate a pulse at $T_1$ for transition indication signal 256. Responsive to detecting the pulse (and transition indication signal 256 being active), high side state machine 266 can toggle the stored state in state storage 268, and store the first state (state 0) in state storage 268. Responsive to state storage 268 storing the first state, high side driver circuit 230 can set high side control signal 222 to the deasserted state (having the voltage of 0 V) to disable high side switch 214.

Figure 4:
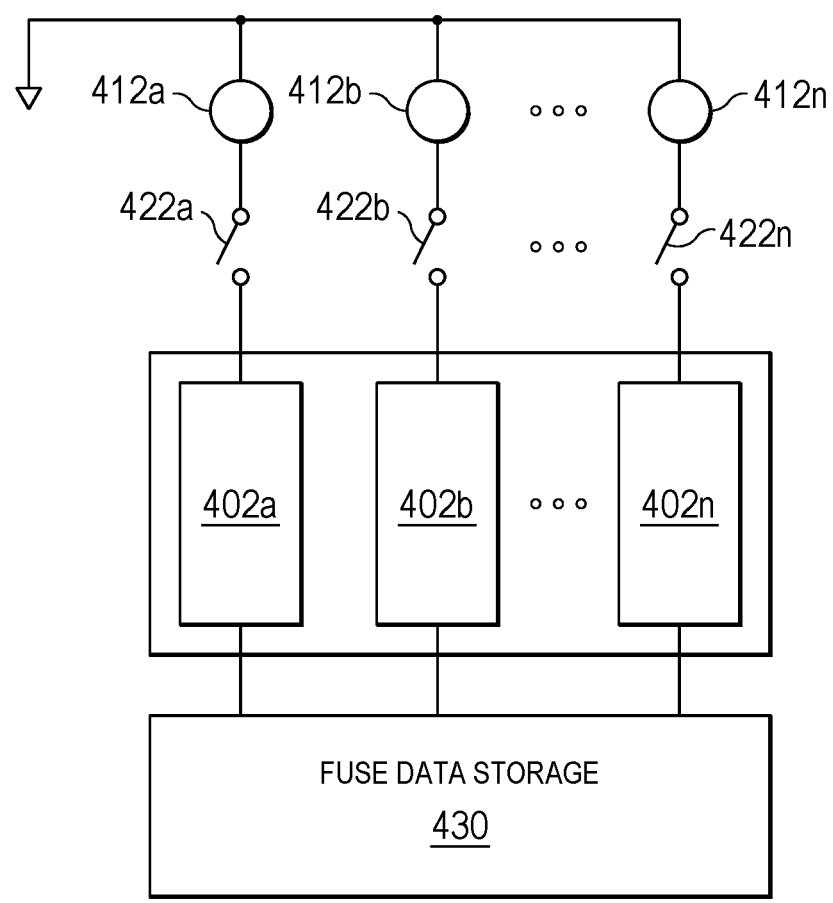
FIG. 4 is a schematic diagram of another example system including a memory.

FIG. 4 illustrates another example of system 100. Referring to FIG. 4, system 100 can include a set of fuse cells, such as fuse cell 402a, 402b, and 402n. Each fuse cell can be programmed to store data. For example, a blown fuse cell can store a logical zero, otherwise the fuse cell can store a logical one. The set of fuse cells can store data that are static, such as configuration data 108. For example, the set of fuse cells can store configuration data that define the frequency of high side control signal 222 and low side control signal 224, a target output voltage $V_{out}$, and a maximum ratio between output voltage $V_{out}$ and input voltage yin.

System 100 can also include power sources (e.g., voltage or current sources) 412a, 412b, and 412n, and switches 422a, 422b, and 422n. Each switch can be coupled between a respective pair of power source and fuse cell to support a read operation of the fuse cell. For example, switch 422a is coupled between power source 412a and fuse cell 402a, switch 422b is coupled between power source 412b and fuse cell 402b, and switch 422c is coupled between power source 412c and fuse cell 402c. To perform a read operation, a switch can be enabled to connect between the pair of power source and fuse cell, and the fuse cell can output a signal representing the stored data (e.g., a voltage signal or a current signal) depending on the resistance of the fuse cell.

System 100 of FIG. 4 can also include a fuse data storage 430. Fuse data storage 430 can be memory 102 of FIG. 1 and can include a RAM or a sequential logic circuit. System 100 can perform a read operation on each fuse cell to obtain a voltage/current signal representing the data stored in the fuse cell, and write the data into fuse data storage 430. After the data is stored in fuse data storage 430, system 100 can power down the set of fuse cells 402 by disabling switches 422 and/or power sources 412. Other circuits that use the data, such as control circuit 212, can access the data from fuse data storage 430 instead of performing read operations on the set of fuse cells 402. Such arrangements can reduce the number and duration of the read operations on the set of fuse cells 402, which can reduce the likelihood of fuse re-growth due to electric field applied across the fuse cells during the read operations of the fuse cells.

Figure 5:
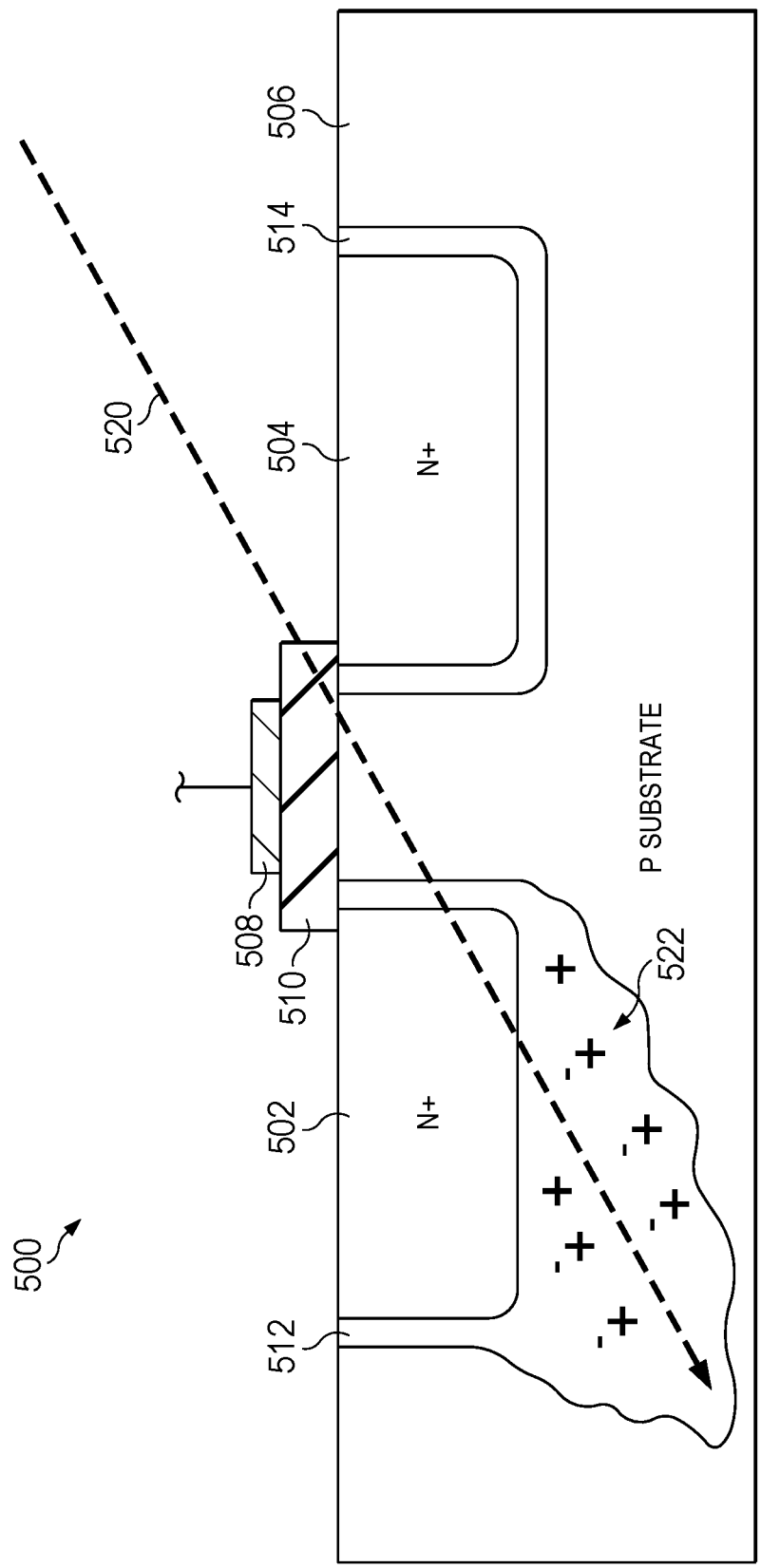
FIG. 5 and FIG. 6 illustrate example effects of a transient upset event.
Figure 6:
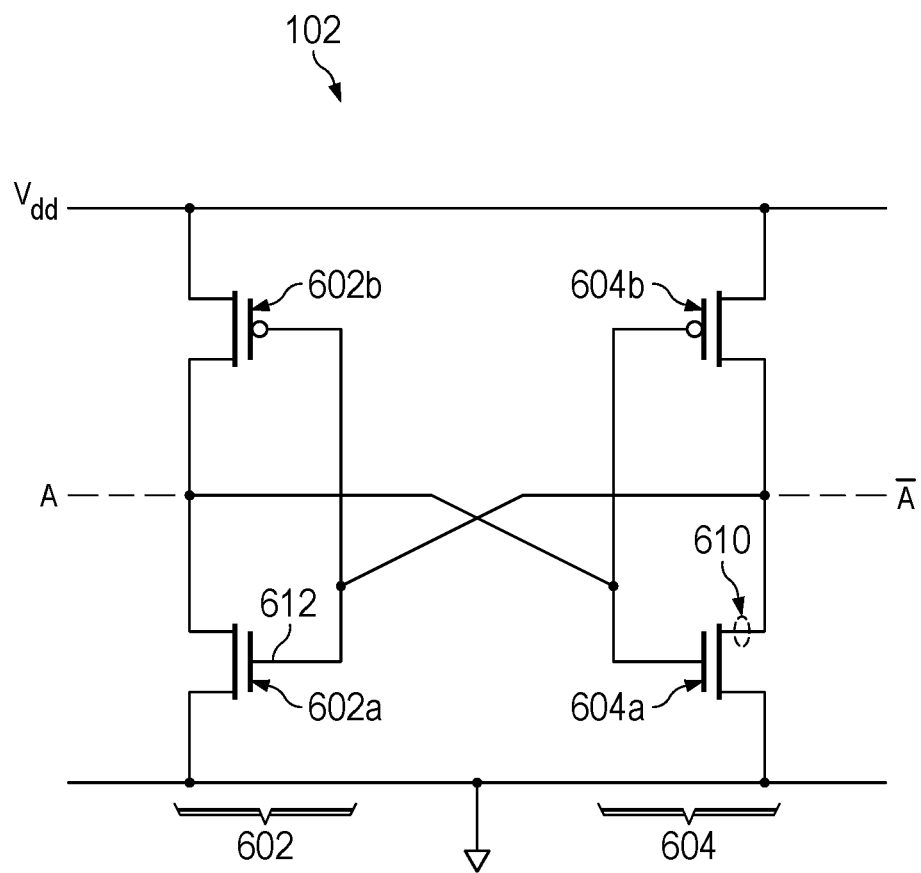

Electronic systems operating in a high radiation environment, such as systems for aerospace and defense applications, can be susceptible to transient upset events. High energy ionizing particles (e.g., ions, electrons, and photons) can strike a circuit component of the system and create free charge by ionization. FIG. 5 and FIG. 6 illustrate schematics of example transient upset events. Referring to FIG. 5, a transistor 500 can include current terminals 502 and 504 (e.g., drain and source terminals) in a substrate 506, a gate terminal 508, and an insulation layer 510 (e.g., an oxide layer). Transistor 500 can also include a depletion region 512 at the p-n junction between current terminal 502 and substrate 506, and a depletion region 514 at the p-n junction between current terminal 504 and substrate 506.

In a transient upset event, high energy ionizing particles 520 can strike depletion regions 512 and/or 514 of transistor 500 and create free charge 522 at the depletion region. The transient upset event can cause a state change in a circuit that includes transistor 500, such as memory 102. FIG. 6 illustrates an example state change caused by the free charge. Referring to FIG. 6, memory 102 can include a pair of cross-coupled inverters 602 and 604 coupled between a power supply that supplies a \Tad voltage and a ground. Inverter 602 can include an N-type field effect transistor (NFET) 602a and a P-type field effect transistor 602b. Inverter 604 can include an NFET 604a and a PFET 604b. Initially, memory 102 may store a logical one, so that node A has a \Tad voltage and node $\overline{A}$ has a ground voltage (e.g., 0 volt). If particles 520 strikes at the depletion region of drain terminal 610 of NFET 604a and create new charge 522, the new charge can flow to gate terminal 612 of NFET 602a and gate terminal 614 of PFET 602b and increase their voltages. The increased gate terminal voltages can disable PFET 602b and enable NFET 602a, which bring the voltage of node A to ground and the voltage of node $\overline{A}$ to the $V_{dd}$ voltage. Accordingly, the transient upset event changes the data stored in memory 102 from a logical one to a logical zero, leading to data corruption at memory 102.

The corruption of memory 102 can lead to malfunction of the electronic system. For example, referring again to FIGS. 2 and 3, if the state data stored in state storage 268 of FIG. 2 becomes corrupted, state storage 268 may store a state 1 instead of a state 0 when low side driver 250 enables low side switch 216. Accordingly, high side driver 260 and low side driver 250 may concurrently enable the respective high side switch 214 and low side switch 216, which can create a direct electrical path between power source 202 and ground. A large current may flow through high side switch 214 and low side switch 216 and damage the switches. Also, the voltage of switching node 218 may reach $V_{in}$, which can create a high voltage stress and damage load 204. Further, in a case where fuse data storage 430 of FIG. 4 provides configuration data, the corruption of fuse data storage 430 can lead to malfunction of the circuit component that operates based on the configuration data. For example, if the configuration data defines a target $V_{out}$ for the power conversion system of FIG. 2, the data corruption can lead to the power conversion system providing an incorrect $V_{out}$ across load 204.

Figure 7:
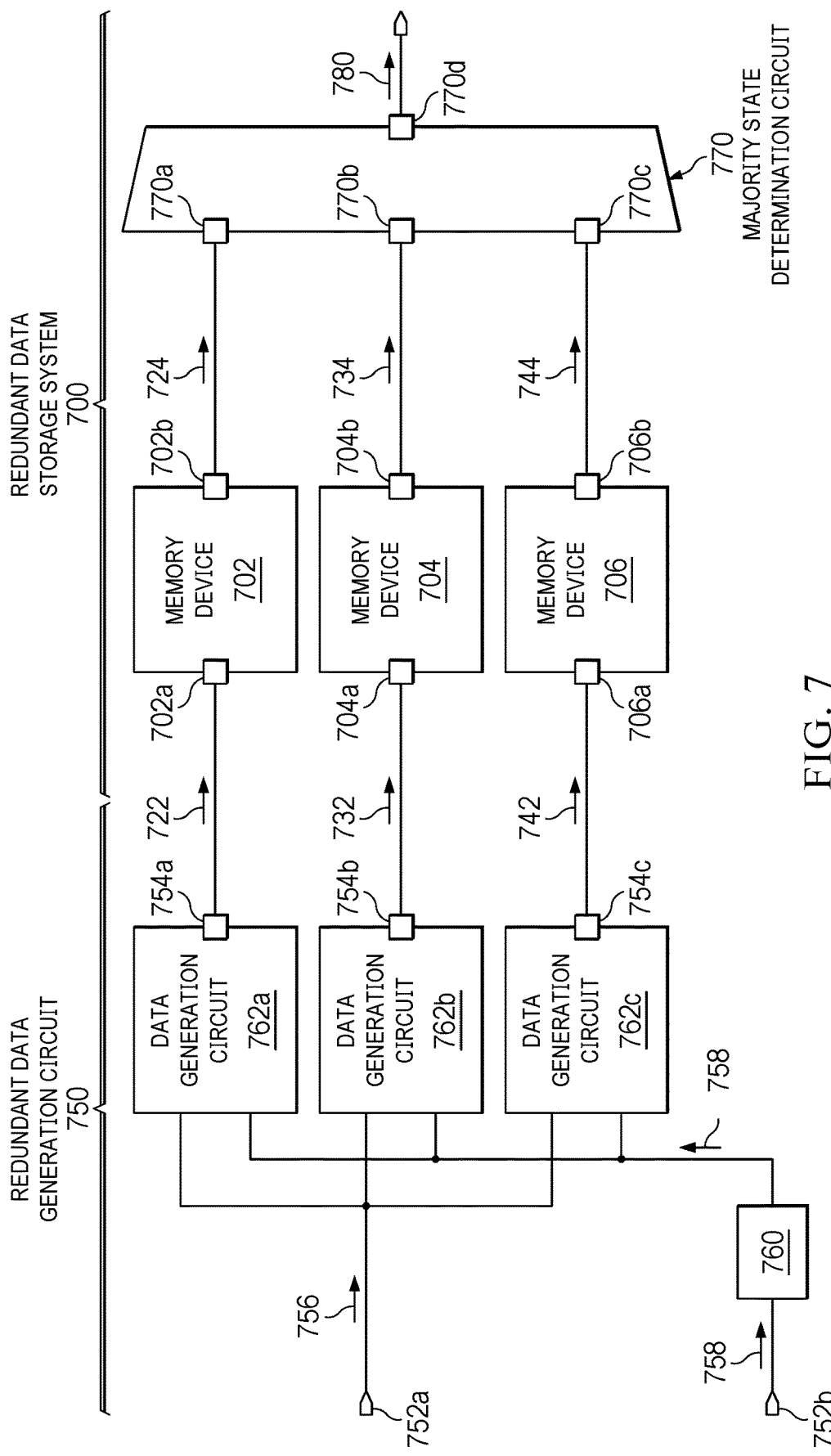
FIG. 7 is a schematic diagram of an example redundant data storage system.

To mitigate the effect of memory data corruption, an electronic system can include a redundant data storage system to store multiple copies of the same data. If one copy of that data is corrupted, the redundant data storage system can provide another uncorrupted copy of the data for accessing. FIG. 7 illustrates an example of a redundant data storage system 700. Referring to FIG. 7, redundant data storage system 700 can include an odd number of memory devices, including memory devices 702, 704, and 706. Each memory device can have a memory data input and a memory data output. The memory device can receive an input data signal at the memory data input and, responsive to the input data signal, store data represented by the input data signal. The memory device can also provide an output data signal representing the data at the memory data output. For example, memory device 702 includes a memory data input 702a to receive an input data signal 722, and a memory data output 702b to provide a candidate output data signal 724. Also, memory device 704 includes a memory data input 704a to receive an input data signal 732, and a memory data output 704b to provide a candidate output data signal 734. Further, memory device 706 includes a memory data input 706a to receive an input data signal 742, and a memory data output 706b to provide a candidate output data signal 744.

Memory devices 702, 704, and 706 can receive respective input data signals 722, 732, and 742 representing the same data from a redundant data generation circuit 750. In some examples, redundant data generation circuit 750 can have a first data input 752a, and a second data input 752b, and redundant data outputs 754a, 754b, and 754c. First data input 752a can receive a relatively active data signal 756 (e.g., control signal 226 of FIG. 2) representing the data to be stored in memory devices 702 through 706, and second data input 752b can receive a relatively static data signal 758 (e.g., a reference voltage signal) which has a lower bandwidth than data signal 756. Redundant data generation circuit 750 can include a filter circuit 760 to filter data signal 758. The filtering can remove transient signals (e.g., caused by high energy ionizing particles) from data signal 758. Also, redundant data generation circuit 750 can include data generation circuits 762a, 762b, and 762c having respective redundant data outputs 754a, 754b, and 754c. In some examples, data generation circuits 762a, 762b, and 762c can each include a comparator to generate respective input data signals 722, 732, and 742 by comparing between data signal 756 with filtered data signal 758.

Also, redundant data storage system 700 can include a majority state determination circuit 770. Majority state determination circuit 770 has an input 770a coupled to memory data output 702a, an input 770b coupled to memory data output 702b, an input 770c coupled to memory data output 702c, and an output 770d. Majority state determination circuit 770 can include logic circuits to receive candidate output data signals 724, 734, and 744, and to determine a majority state of the data (majority data) stored in memory devices 702 through 706 based on their candidate output data signals 724, 734, and 734, and provide a data signal 772 representing the majority state at output 750d. In a case where redundant data storage system 700 has an N number of memory devices or otherwise store N copies of data, where N is an odd number, majority state determination circuit 770 can identify the common data stored in at least ⌊N/2⌋+1 number of memory devices as the majority state. In the example of FIG. 7, if the data of at least two out of three memory devices 702, 704, and 706 is a logical one, majority state determination circuit 770 can determine that the majority data is a logical one, and provide a final output data signal 780 representing the logical one. Also, if the data of at least two out of three memory devices 702, 704, and 706 is a logical zero, majority state determination circuit 770 can determine that the majority data is a logical zero, and provide final output data signal 780 representing the logical zero.

With such arrangements, even if high energy ionizing particles strike one of memory devices 702, 704, or 706 and corrupt the data stored at the affected memory device, or high energy ionizing particles strike one of data generation circuits 762a, 762b, and 762c and corrupt one of input data signals 722, 732, and 742, and the data stored in one of memory devices 702, 704, or 706 becomes corrupted, the corrupted data is the minority, and the uncorrupted data is the majority. Redundant data storage system 700 can still provide the uncorrupted data as the majority data for accessing, which can mitigate the effect of data corruption in a transient upset event.

Although redundant data storage system 700 can mitigate the effect of data corruption caused by a single strike of high energy ionizing particles, if there are multiple strikes of high energy ionizing particles at different memory devices at different times, redundant data storage system 700 may still provide corrupted data. Because of the multiple strikes, a majority of memory devices may store the corrupted data, and the corrupted data become the majority.

Figure 8A:
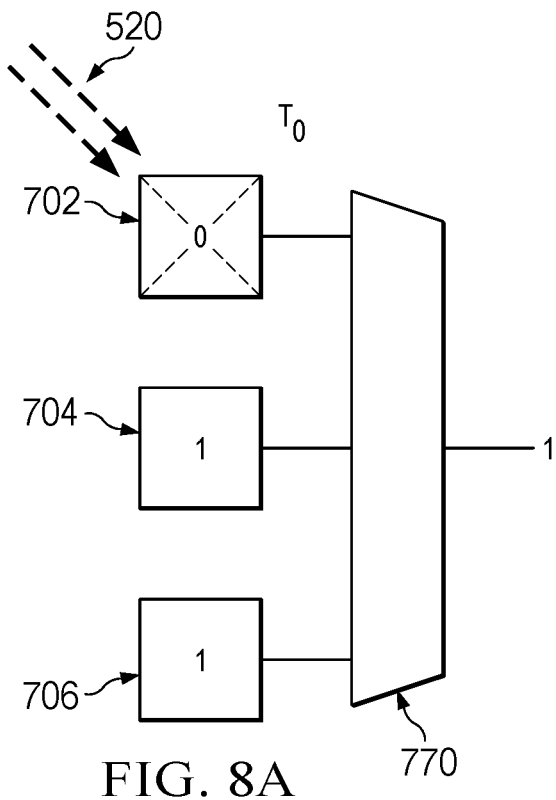
FIG. 8A and FIG. 8B illustrate example effects of multiple transient upset events on the redundant data storage system of FIG. 7.
Figure 8B:
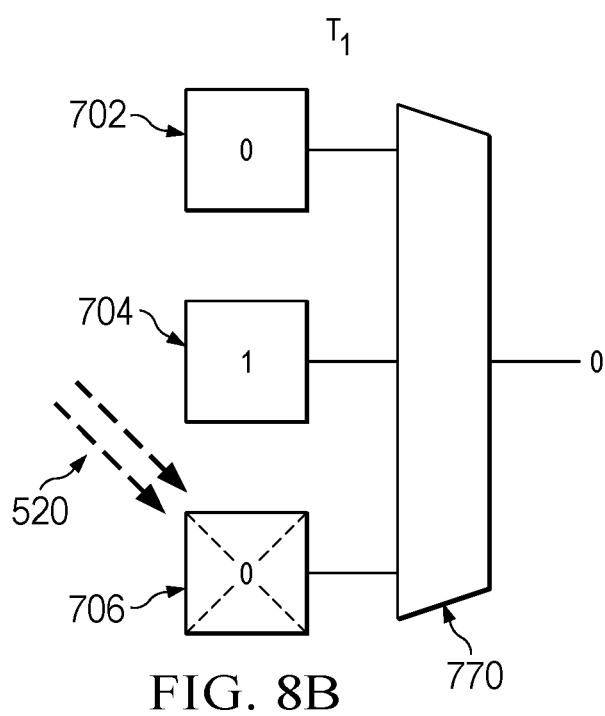

FIG. 8A and FIG. 8B illustrate example effects of multiple transient upset events on redundant data storage system 700. In the example of FIG. 8A and FIG. 8B, redundant data storage system 700 stores a logical one in each of memory devices 702, 704, and 706 prior to the transient upset events. Referring to FIG. 8A, at time $T_0$, memory device 702 (or data generation circuits 762a) is struck by high energy ionizing particles 520 in a first transient upset event, which corrupts the data stored at memory device 702 and the data becomes a logical zero. But because the majority of the memory devices still store the uncorrupted data (logical one), majority state determination circuit 770 can select the uncorrupted data as the majority data and output the logical one.

Referring to FIG. 8B, at time $T_1$, memory device 706 (or data generation circuits 762c) is struck by high energy ionizing particles 520 again in second transient upset event, which corrupts the data stored at memory device 706 and the data becomes a logical zero. Because memory device 702 still stores the corrupted data (logical zero), the majority of the memory devices (two out of three) now store the corrupted data. Accordingly, majority state determination circuit 770 can select the corrupted data as the majority data and output the logical zero, and redundant data storage system 700 fails to mitigate the effect of data corruption caused by the multiple strikes of high energy ionizing particles.

Figure 9:
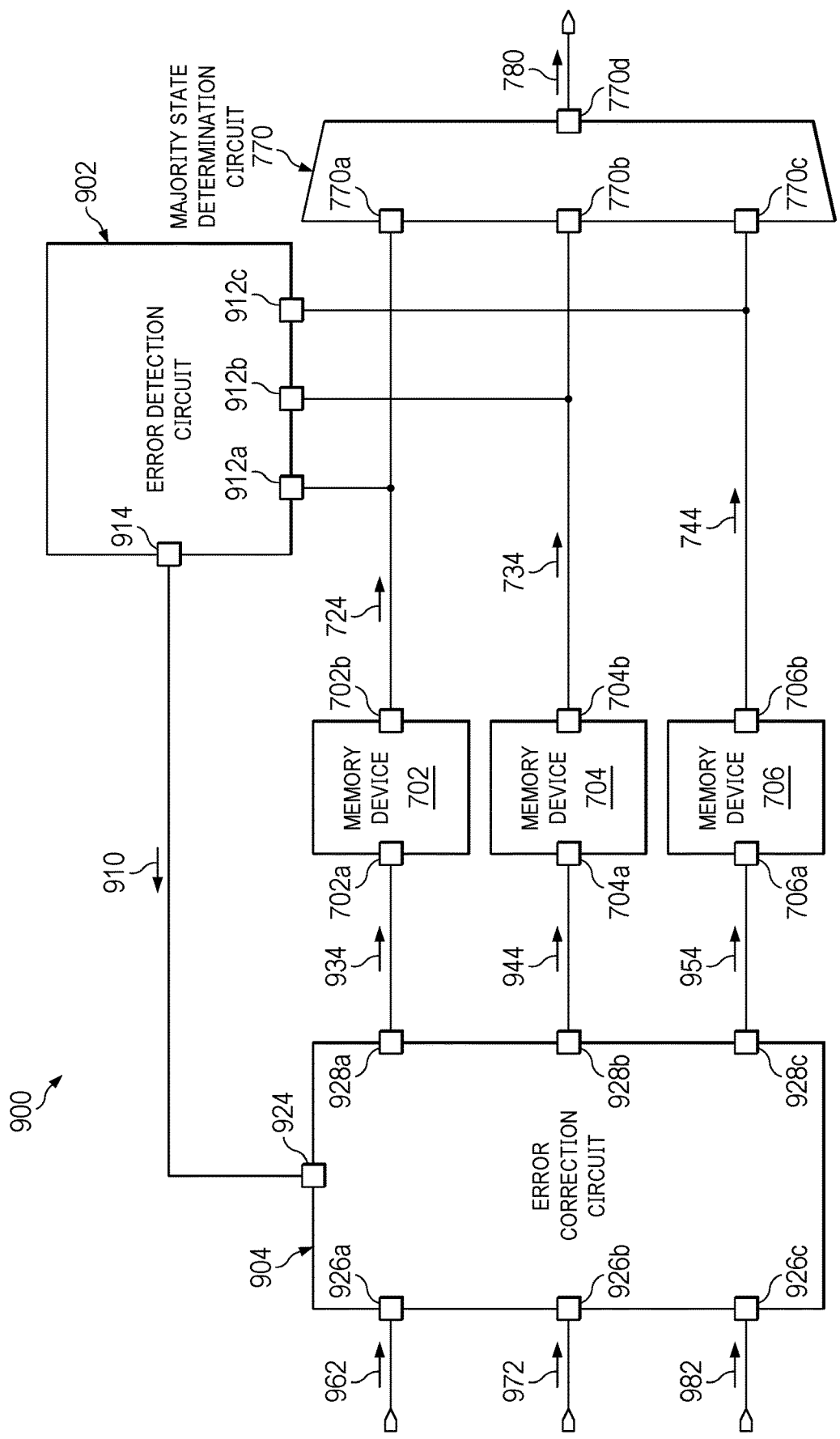
FIG. 9 is a schematic diagram of another example redundant data storage system.

FIG. 9 illustrates an example of a redundant data storage system 900 that can address at least some of the issues above. Referring to FIG. 9, redundant data storage system 900 can include components of redundant data storage system 700 such as memory devices 702, 704, and 706, and majority state determination circuit 770, which form a forward data path. Redundant data storage system 900 can also include an error detection circuit 902 and an error correction circuit 904, which form a feedback data path. Error detection circuit 902 can detect a data error (or corrupted data) among copies of the data stored in memory devices 702, 704, and 706, and provide a correction signal 910 representing the majority data (which represent the stored data in the uncorrupted/original state) to error correction circuit 904. Responsive to correction signal 910, error correction circuit 904 can write the majority data back to the corrupted memory device to correct the data error, and to restore the stored data back to the uncorrupted/original state, as part of a feedback data path operation. With such arrangements, error detection circuit 902 and error correction circuit 904 can replace the corrupted data with the uncorrupted data in the corrupted memory devices prior to the next transient upset event, so that the uncorrupted data can remain the majority after the next transient upset event, and redundant data storage system 700 can still provide final output data signal 780 representing the uncorrupted data.

Error detection circuit 902 has inputs 912a, 912b, and 912c coupled to the respective memory data outputs 702a, 702b, and 702c, and a detection output 914. Error detection circuit 902 can receive candidate output data signals 724, 734, and 744 at the respective inputs 912a, 912b, and 912c and detect a data error among memory devices 702, 704, and 706. Error detection circuit 902 can detect the data error by detecting a mismatch in the data stored in memory devices 702, 704, and 706 based on candidate output data signals 724, 734, and 744. Error detection circuit 902 can also determine the majority data stored in memory devices from candidate output data signals 724, 734, and 744. Responsive to detecting the data error, error detection circuit 902 can generate correction signal 910 representing the majority data, and provide correction signal 910 at detection output 914.

Also, error correction circuit 904 has correction input 924, external data inputs 926a, 926b, and 926c, and correction outputs 928a, 928b, and 928c. Detection output 914 of error detection circuit 902 is coupled to correction input of error correction circuit 904. Also, correction outputs 928a, 928b, and 928c of error correction circuit 904 are coupled to the respective memory data inputs 702a, 704a, and 704b. Responsive to correction signal 910 at correction input 924, error correction circuit 904 can provide an input data signal representing the majority data to the corrupted memory device, to overwrite the corrupted data with the majority data at the corrupted memory device. In some examples, error correction circuit 904 can provide the input data signal only to the corrupted memory device responsive to the correction signal 910. For example, if memory device 702 is corrupted, error correction circuit 904 can provide only input data signal 934 to memory device 702. Also, if memory device 704 is corrupted, error correction circuit 904 can provide only input data signal 944 to memory device 704. Further, if memory device 706 is corrupted, error correction circuit 904 can provide only input data signal 954 to memory device 702. In some examples, responsive to correction signal 910, error correction circuit 904 can also provide input data signals 934, 944, and 954 representing the same majority data to overwrite the data stored in the respective memory devices 702, 704, and 706, and can overwrite both the corrupted and uncorrupted data.

In addition, error correction circuit 904 can receive external input data signals 962, 972, and 982 at the respective external data inputs 926a, 926b, and 926c. External input data signals 962, 972, and 982 can represent external data to be stored at memory devices 702, 704, and 706. In some examples, error correction circuit 904 may receive input data signals 722, 732, and 742 from redundant data generation circuit 750 as the respective external input data signals 962, 972, and 982. Responsive to receiving external input data signals 962, 972, and 982 representing the external data, error correction circuit 904 can ignore correction signal 910 and provide input data signals 934, 944, and 954 representing the external data to the respective memory devices 702, 704, and 706. The external data can then be provided via majority state determination circuit 770 as part of the forward data path operation.

The detection of data mismatch by error detection circuit 902, the generation of correction signal 910 by error correction circuit 904, and the correction of the corrupted data in the memory device based on correction signal 910, can each be an asynchronous operation, or a synchronous operation. For example, error detection circuit 902 can detect data mismatch and generate correction signal 910 asynchronously when one of the memory devices stores corrupted data, and overwrite the corrupted data in that memory device asynchronously upon receiving correction signal 910. The asynchronous error correction operation does not require a clock signal for synchronization, which can reduce power consumption and allow redundant data storage system 900 to be implemented without additional clock generation and buffering circuitries.

Also, in a synchronous operation, error detection circuit 902 can sample the data stored in the memory devices periodically according to a clock signal, and the detection of data mismatch and generation of correction signal 910 are synchronized to the clock signal. Also, in some examples where the memory device is a synchronized memory device (e.g., a flip-flop, a synchronous DRAM, and a synchronous burst SRAM), the detection of data mismatch (which involves read access to the memory device) and the overwriting of the corrupted data (which involves write access to the memory device) can both be synchronized to a signal (e.g., a clock signal, or a sequence of control signals).

Also, in some examples, error detection circuit 902 and error correction circuit 904 can be part of an application-specific integrated circuit (ASIC) or can be implemented on programmable logic device, such as a field effect programmable logic array (FPGA), both of which can interface with or include redundant data storage system 700. In some examples, a processor, such as a controller or a central processing unit (CPU), can execute instructions from a memory to perform the operations of error detection circuit 902 and error correction circuit 904.

Figure 10:
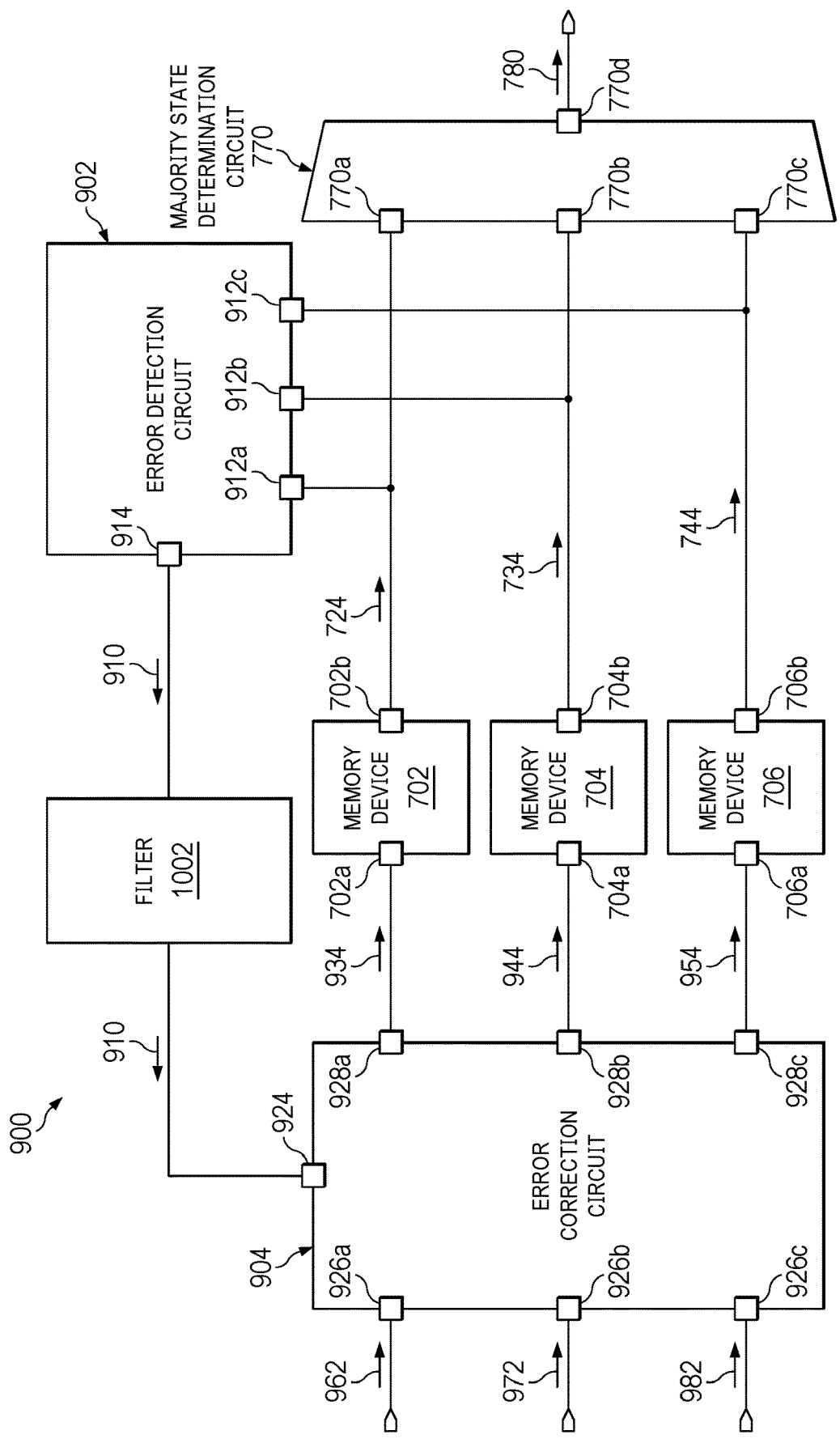
FIG. 10 is a schematic diagram of another example redundant data storage system.

FIG. 10 illustrates another example of redundant data storage system 900. In the example of FIG. 10, redundant data storage system 900 can include a filter 1002 coupled between detection output 914 of error detection circuit 902 and correction input 924 of error correction circuit 904. Filter 1002 can be a low-pass filter to remove transient components of correction signal 910 not contributed by the data mismatch among memory devices 702, 704, and 706. One example source of the transient components is timing mismatch among candidate output data signals 724, 734, and 744 from the respective memory devices 702, 704, and 706. Because of the timing mismatch, candidate output data signals 724, 734, and 744 representing the same data can arrive at error detection circuit 902 at different times, which causes error detection circuit 902 to erroneously detect a data mismatch. Another example source is a high frequency signal source (e.g., high frequency clocks), and the high frequency signal can be coupled into the electrical connection that carries correction signal 910 as a high frequency noise signal. In some examples, filter 1002 can include an analog RC filter having an RC time constant that exceeds the timing mismatch but below an average duration between transient upset events (e.g., an average duration between two strikes of ionizing particles 520). In some examples, filter 1002 can also include a digital filter. The digital filters can include a sample and hold circuit to sample correction signal 910, and a computation circuit (e.g., a digital signal processor) to compute an average from a certain number of samples, and provide the average as the filtered signal. The number of samples can span a time duration that exceeds the timing mismatch but below the average duration between transient upset events. The digital filter can be implemented as ASIC, FPGA, or as software instructions executable by a processor.

In the example of FIG. 10, filter 1002 is provided along the feedback data path to filter correction signal 910, rather than along the forward data path to filter input data signals (e.g., input data signals 724-744 and 934-954) and output data signal (e.g., output data signal 780). Such arrangements can avoid filter 1002 introducing latency and limiting the bandwidth of the forward data path, which in turn can improve the overall performance of the system that operates on the data stored in redundant data storage system 900. For example, referring again to power converter system 100 of FIG. 2, the latency of high side driver circuit 230 in enabling/disabling high side switch 214 can be in the order of a few nano-seconds, which allows power converter system 100 to operate at a high frequency (e.g., in the Mega-Hertz range) to reduce energy leakage from energy storage element 220. In a case where state storage 268 includes redundant data storage system 900, improving the bandwidth of the forward data path (e.g., by not having filter 1002 to filter the input and output data signals) of redundant data storage system 900 can reduce the overall latency of high side driver circuit 230. Also, due to transient upset events occurring at a much lower frequency than the input/output data signals, filter 1002 can have a much lower bandwidth than the input/output data signals to remove high bandwidth disturbances to correction signal 910.

Figure 11:
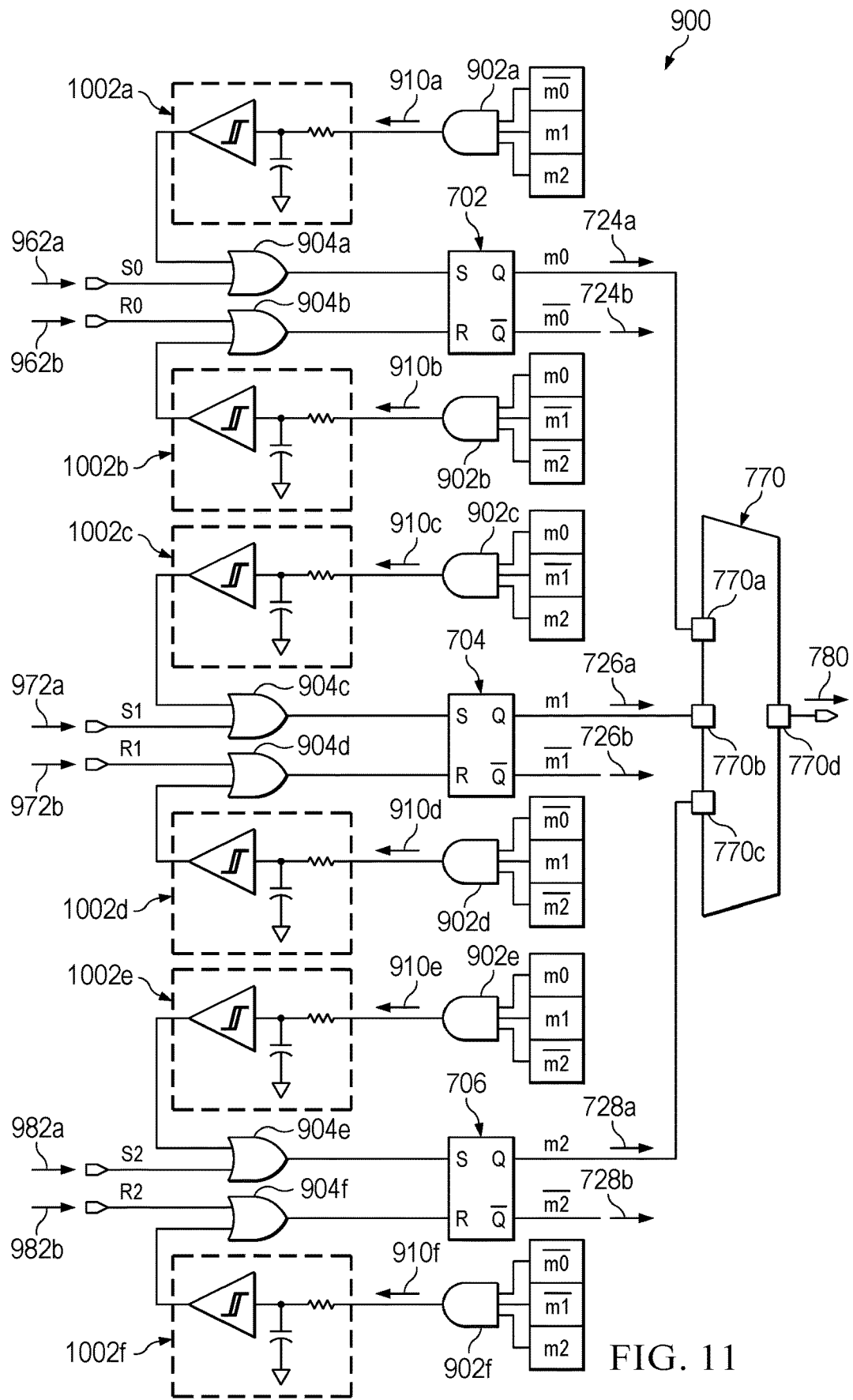
FIG. 11 is a schematic diagram of example internal components of the redundant data storage system of FIGS. 9 and 10.

FIG. 11 is a schematic diagram of examples internal components of redundant data storage system 900. In the example of FIG. 11, the detection of data mismatch by error detection circuit 902, the generation of correction signal 910 by error correction circuit 904, and the correction of the corrupted data in the memory device based on correction signal 910, can each be an asynchronous operation. Referring to FIG. 11, each of memory device 702, 704, and 706 can include a sequential logic circuit, such as an R-S latch. Each R-S latch has a set input (labelled S) and a reset input (labelled R) as the memory data input. Each R-S latch also has a non-inverting output (labelled Q) and an inverting output (labelled Q) as the memory data output. With the set input in an asserted state (having a logical one) and the reset input in the deasserted state (having a logical zero), the R-S latch can latch/store a logical one, and provide a logical one at the non-inverting output and a logical zero at the inverting output. With the reset input in an asserted state and the set input in a deasserted state, the R-S latch can latch/store a logical zero, and provide a logical zero at the non-inverting output and a logical one at the non-inverting output. With both set input and reset input in the deasserted state, the R-S latch can retain the stored data. Memory data element/R-S latch 702 can provide a candidate output data signal 724a (also labelled m0) at the non-inverting output and a candidate output data signal 724b (also labelled $\overline{m0}$) at the inverting output. Memory data element/R-S latch 704 can provide a candidate output data signal 726a (also labelled m0) at the non-inverting output and a candidate output data signal 726b (also labelled $\overline{m1}$) at the inverting output. Also, memory data element/R-S latch 706 can provide a candidate output data signal 728a (also labelled m2) at the non-inverting output and a candidate output data signal 728b (also labelled $\overline{m2}$) at the inverting output. The non-inverting outputs of R-S latches 702, 704, and 706 are coupled to the respective inputs 770a, 770b, and 770c of majority state determination circuit 770.

Also, error detection circuit 902 can include error detection subcircuits 902a, 902b, 902c, 902d, 902e, and 902f. Each error detection subcircuit can include an AND logic gate configured to, responsive to the candidate output data signals, generate a correction signal for the set input and a correction signal for the reset input. An error detection subcircuit can generate an asserted correction signal for the set input of a particular R-S latch if that R-S latch stores a logical zero while the other two R-S latches (the majority) store a logical one. Also, an error detection subcircuit can generate an asserted correction signal for the reset input of a particular R-S latch if that R-S latch stores a logical one while the other two R-S latches (the majority) store a logical zero.

Accordingly, error detection subcircuit 902a can receive candidate output data signals 724b, 726a, and 728a, and provide a correction signal 910a for the set input of R-S latch 702. Error detection subcircuit 902b can receive candidate output data signals 724a, 726b, and 728b, and provide a correction signal 910b for the reset input of R-S latch 702. Also, error detection subcircuit 902c can receive candidate output data signals 724a, 726b, and 728a, and provide a correction signal 910c for the set input of R-S latch 704. Error detection subcircuit 902d can receive candidate output data signals 724b, 726b, and 728b, and provide a correction signal 910d for the reset input of R-S latch 704. Further, error detection subcircuit 902e can receive candidate output data signals 724a, 726a, and 728b, and provide a correction signal 910e for the set input of R-S latch 706. Error detection subcircuit 902f can receive input data signals 724b, 726b, and 728a, and provide a correction signal 910f for the reset input of R-S latch 706.

Also, error correction circuit 904 can include error correction subcircuits 904a, 904b, 904c, 904d, 904e, and 904f. Each error correction subcircuit can include an OR logic gate with a first input coupled to the output of an error detection subcircuit and a second input coupled to an external data input. The OR logic gate can provide an asserted signal output if at least one of an output of the error detection subcircuit or the external data input has an asserted state.

Specifically, error correction subcircuit 904a can provide a set signal to R-S latch 702 and have inputs coupled to the output of error detection circuit 902a to receive correction signal 910a, and an external set input (labelled S0) to receive external input data signal 962a. Error correction subcircuit 904a can write a logical one into R-S latch 702 if at least one of correction signal 910a or external input data signal 962a has an asserted state. Error correction subcircuit 904b can provide a reset signal to R-S latch 702 and have inputs coupled to the output of error detection circuit 902b to receive correction signal 910b, and an external set input (labelled R0) to receive external input data signal 962b. Error correction subcircuit 904b can write a logical zero into R-S latch 702 if at least one of correction signal 910b or external input data signal 962b has an asserted state.

Also, error correction subcircuit 904c can provide a set signal to R-S latch 704 and have inputs coupled to the output of error detection circuit 902c to receive correction signal 910c, and an external set input (labelled S1) to receive external input data signal 972a. Error correction subcircuit 904c can write a logical one into R-S latch 704 if at least one of correction signal 910c or external input data signal 972a has an asserted state. Error correction subcircuit 904d can provide a reset signal to R-S latch 702 and have inputs coupled to the output of error detection circuit 902d to receive correction signal 910d, and an external set input (labelled R1) to receive external input data signal 972b. Error correction subcircuit 904d can write a logical zero into R-S latch 704 if at least one of correction signal 910d or external input data signal 972b has an asserted state.

Further, error correction subcircuit 904e can provide a set signal to R-S latch 706 and have inputs coupled to the output of error detection circuit 902e to receive correction signal 910e, and an external set input (labelled S2) to receive external input data signal 982a. Error correction subcircuit 904e can write a logical one into R-S latch 706 if at least one of correction signal 910e or external input data signal 982a has an asserted state. Error correction subcircuit 904f can provide a reset signal to R-S latch 706 and have inputs coupled to the output of error detection circuit 902f to receive correction signal 910d, and an external set input (labelled R2) to receive external input data signal 982b. Error correction subcircuit 904f can write a logical zero into R-S latch 706 if at least one of correction signal 910f or external input data signal 982b has an asserted state.

Also, in the example of FIG. 11, filter 1002 can include filter subcircuits 1002a, 1002b, 1002c, 1002d, 1002e, and 1002f Filter subcircuit 1002a can be coupled between error detection circuit 902a and error correction circuit 904a. Filter subcircuit 1002b can be coupled between error detection circuit 902b and error correction circuit 904b. Filter subcircuit 1002c can be coupled between error detection circuit 902c and error correction circuit 904c. Filter subcircuit 1002d can be coupled between error detection circuit 902d and error correction circuit 904d. Filter subcircuit 1002e can be coupled between error detection circuit 902e and error correction circuit 904e. Filter subcircuit 1002f can be coupled between error detection circuit 902f and error correction circuit 904f Each filter subcircuit can include an R-C filter. In some examples, each filter subcircuit can also include a buffer, such as a Schmitt trigger, to improve the edge rate and voltage swing of the respective filtered correction signal.

Figure 12:
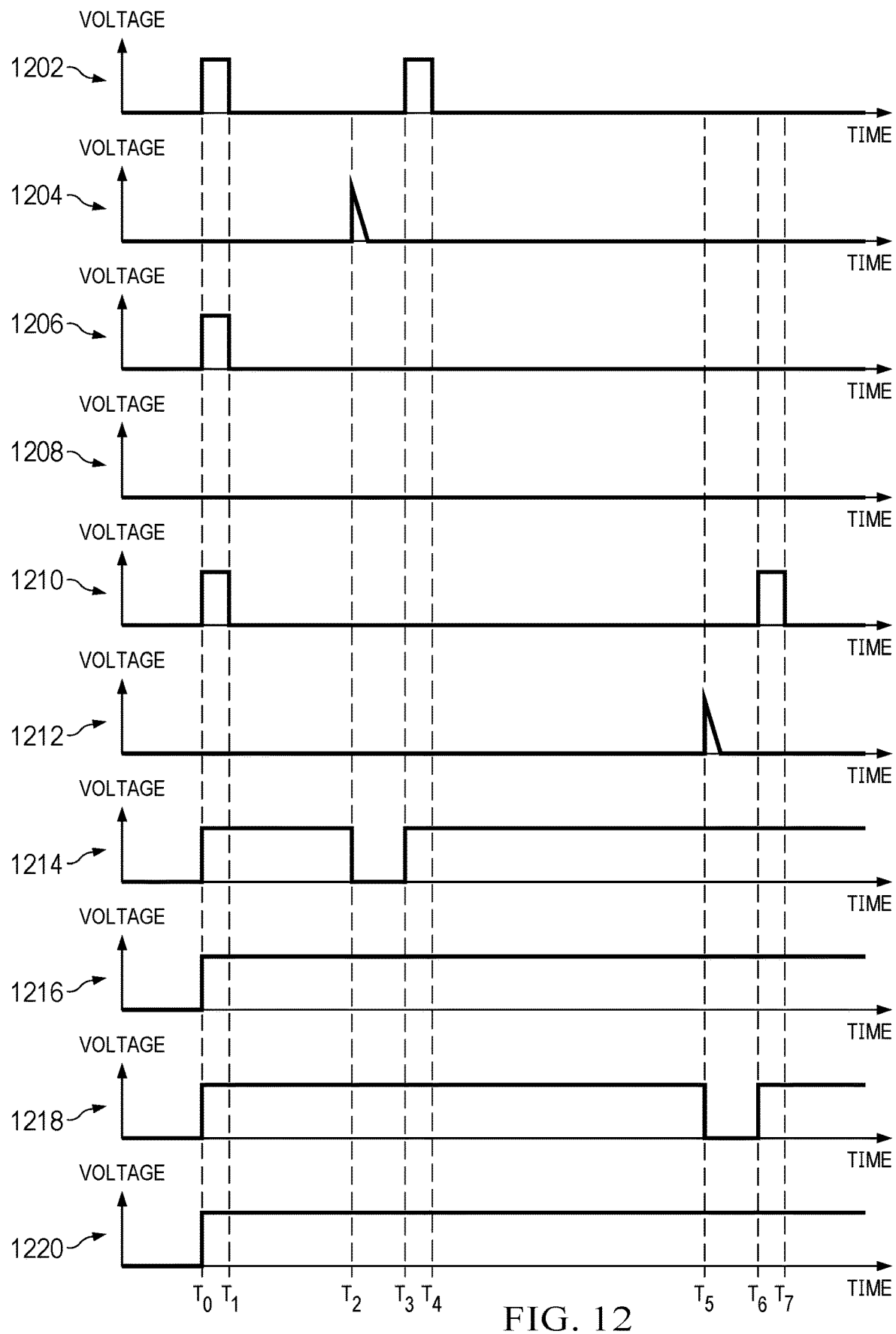
FIG. 12 illustrates graphs of example operations of redundant data storage system of FIGS. 9 and 10.

FIG. 12 includes graphs that illustrate example operations of redundant data storage system 900 of FIG. 11. FIG. 12 includes graphs 1202, 1204, 1206, 1208, 1210, 1212, 1214, 1216, 1218, and 1220. Graph 1202 illustrates an example time-variation of the state of set input of R-S latch 702. Graph 1204 illustrates an example time-variation of the state of reset input of R-S latch 702. Graph 1206 illustrates an example time-variation of the state of set input of R-S latch 704. Graph 1208 illustrates an example time-variation of the state of reset input of R-S latch 704. Graph 1210 illustrates an example time-variation of the state of set input of R-S latch 706. Graph 1212 illustrates an example time-variation of the state of reset input of R-S latch 706. Also, graph 1214 illustrates an example time-variation of the state of the non-inverting output (Q) of R-S latch 702. Graph 1216 illustrates an example time-variation of the state of the non-inverting output (Q) of R-S latch 704. Graph 1218 illustrates an example time-variation of the state of the non-inverting output (Q) of R-S latch 706. Graph 1220 illustrates an example time-variation of the output data signal 780 from majority state determination circuit 770.

Referring to graphs 1202 through 1220, between $T_0$ and $T_1$, the set input of R-S latches 704, 706, and 708 can be in the asserted state. Accordingly, each of R-S latches 704, 706, and 708 can store a logical one, and majority state determination circuit 770 can output a logical one starting from $T_0$. After $T_1$, the set input of R-S latches 704, 706, and 708 can be in the deasserted state, and each of R-S latches 704, 706, and 708 can retain the stored logical one data.

Referring to graph 1204, at $T_2$, a first transient upset event can occur at the reset input of R-S latch 702, which leads to the reset input being asserted momentarily. Referring to graph 1214, the assertion of the reset input causes R-S latch 702 to write a logical zero at $T_2$, which corrupts the data stored at R-S latch 702. With R-S latch 702 storing a logical zero, candidate output data signal 724b transitions to the asserted state, while candidate output data signals 726a and 728a are also in the asserted state. Accordingly, error detection circuit 902a can provide an asserted correction signal 910a, and the set input of R-S latch 702 can transition to the asserted state at $T_3$. A logical one can be written into R-S latch 702, and the output of majority state determination circuit 770 remains a logical one. Responsive to R-S latch 702 storing a logical one and storing the same data as R-S latches 704 and 706, error detection circuit 902a can deassert correction signal 910a, and the set input of R-S latch 702 can transition back to the deasserted state at $T_4$.

Referring to graph 1212, at $T_5$, a second transient upset event can occur at the reset input of R-S latch 706, which leads to the reset input being asserted momentarily. The assertion of the reset input causes R-S latch 706 to write a logical zero at $T_5$, which corrupts the data stored at R-S latch 706. With R-S latch 706 storing a logical zero, candidate output data signal 728b transitions to the asserted state. Candidate output data signal 726a is also in the asserted state. Also, due to the prior data correction operation at $T_4$ for R-S latch 702, candidate output data signal 724a is also in the asserted state. Accordingly, error detection circuit 902e can provide an asserted correction signal 910e, and assert the set input of R-S latch 706 at $T_6$. A logical one can be written into R-S latch 706, and the output of majority state determination circuit 770 remains a logical one. Responsive to R-S latch 706 storing a logical one and storing the same data as R-S latches 702 and 704, error detection circuit 902e can deassert correction signal 910e, and the set input of R-S latch 706 can transition back to the deasserted state at $T_7$.

Figure 13:
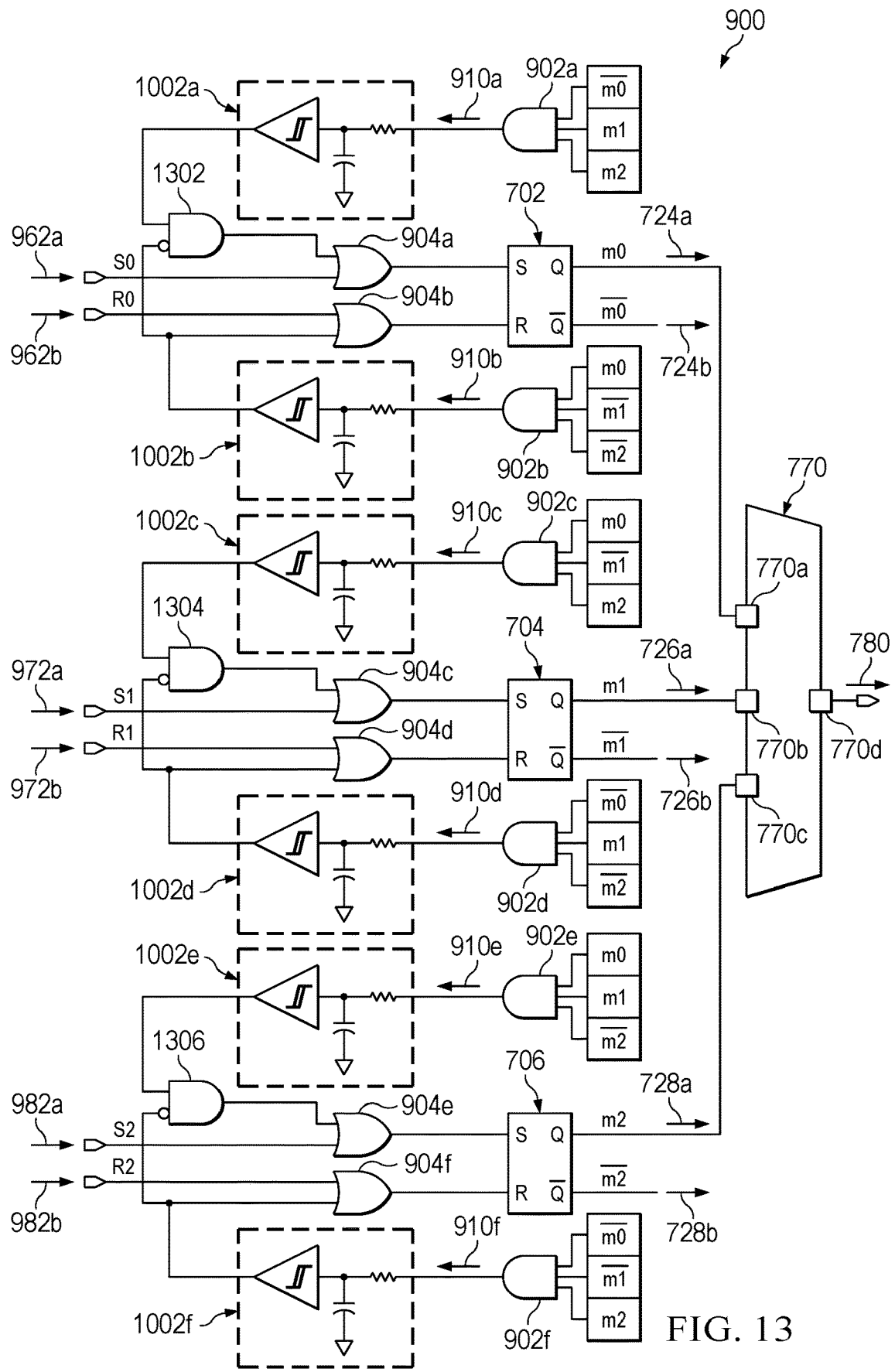
FIGS. 13 and 14 are schematic diagrams of example internal components of the redundant data storage system of FIGS. 9 and 10.

FIG. 13 illustrates additional examples of internal components of the example redundant data storage system 900 of FIG. 11. In the example of FIG. 13, redundant data storage system 900 can include a logic gate 1302 having inputs coupled to the outputs of error detection circuits 902a and 902b, a logic gate 1304 having inputs coupled to the outputs of error detection circuits 902c and 902d, and a logic gate 1306 having inputs coupled to the outputs of error detection circuits 902e and 902f Each of logic gates 1302, 1304, and 1306 can receive a correction signal for the set input and a correction signal for the reset input, and can provide a deasserted correction signal for the set input if the correction signal for the reset input is in the asserted state. Such arrangements can prevent asserting both the set and reset inputs of an R-S latch at the same time, which can lead to RS-latch entering an undefined state.

Figure 14:
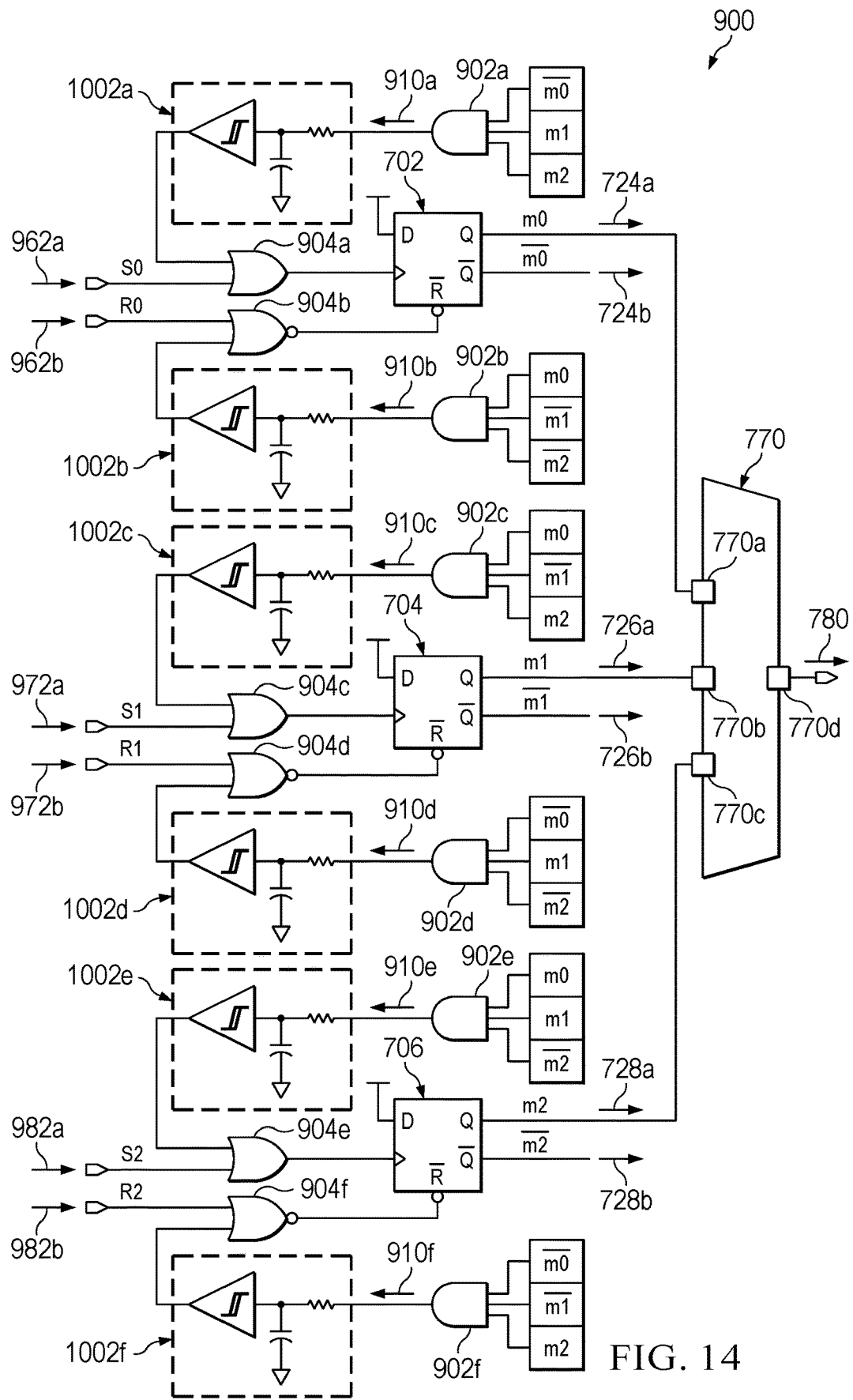

FIG. 14 illustrates additional examples of internal components of redundant data storage system 900. In the example of FIG. 14, each of memory devices 702, 704, and 706 can include a flip-flop, such as a D flip-flop. The data input (D) of each flip-flop can be coupled to a voltage source that provides a voltage representing a logical one. Also, the clock input of each flip-flop can be coupled to the output of the respective error correction circuits 904a, 904c, and 904e. Also, the flip-flops of the memory devices can each store a logical one asynchronously responsive to the output of the respective error correction circuits 904a/904c/904e transitioning from the deasserted state to the asserted state. Further, the reset input of each flip-flop (R̄), which can be actively low, can be coupled to the output of the respective error correction circuits 904b, 904d, and 904f, each of which can include a NOR gate. The flip-flops can each be reset asynchronously and store a logical zero responsive to the output of the respective error correction circuits 904b/904d/904f having the deasserted state. The non-inverting output (Q) and inverting output (Q̄) of each flip-flop can be coupled to majority state determination circuit 770 and error detection circuits 902a-902f, similar to the R-S latches in FIG. 11 and FIG. 13, and error detection circuits 904a-904f can detect data mismatch and generate the respective correction signals 910a-910f asynchronously.

Figure 15:
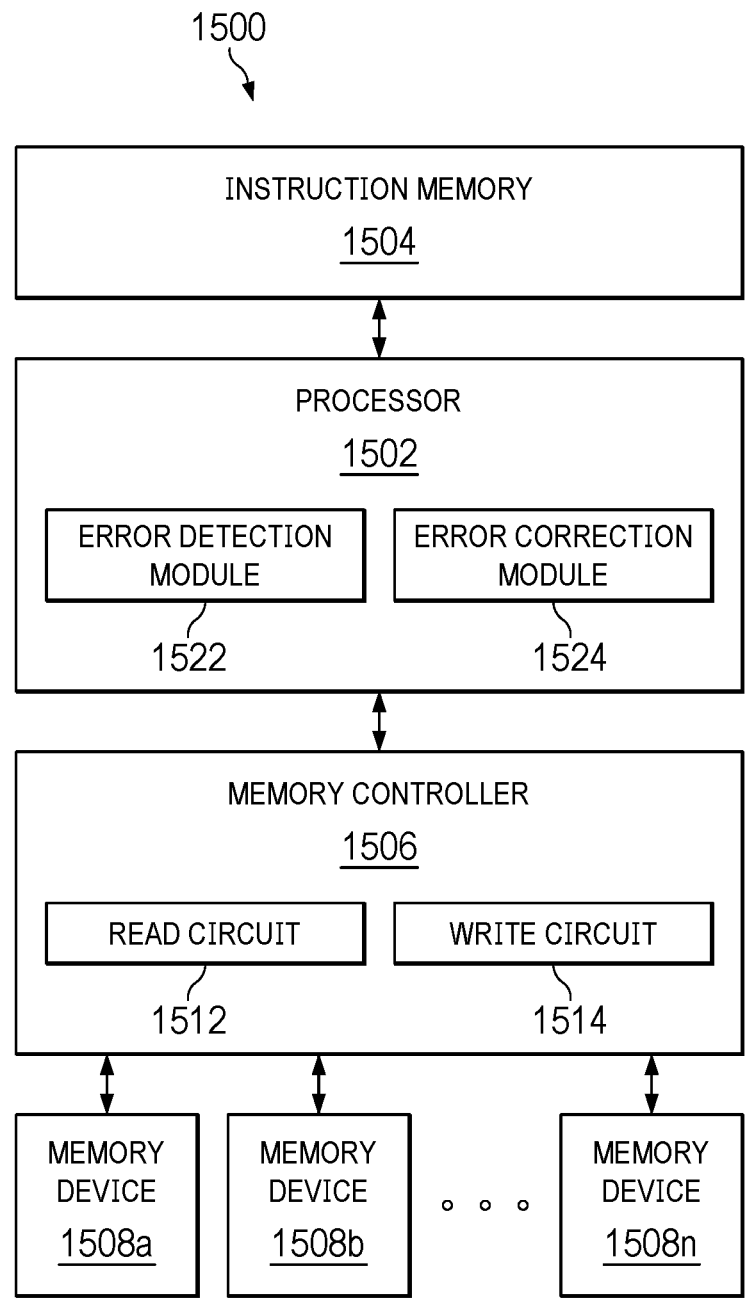
FIG. 15 is a schematic diagram of an example system including redundant data storage.

FIG. 15 illustrates an example system 1500 including redundant data storage. System 1500 can include a processor 1502, an instruction memory 1504, a memory controller 1506, and a set of memory devices including memory devices 1508a-1508n, each of which can store redundant copies of a piece of data. The memory devices can be part of a random access memory (RAM) array, such as a DRAM array, an SRAM array, or a MRAM array. Processor 1502 can include a controller, or a central processing unit (CPU).

Memory controller 1506 can provide an interface between processor 1502 and memory devices 1508a-1508n. For example, memory controller 1506 can include a read circuit 1512 and a write circuit 1514. Read circuit 1512 can receive a read request including read memory addresses from processor 1502. Responsive to the read request, read circuit 1516 can perform read operations to read data at the read memory addresses of memory devices 1508a-1508n, and provide the data to processor 1502. Also, write circuit 1518 can receive a write request including write memory addresses and data to be written from processor 1502. Responsive to the write request, write circuit 1514 can perform write operations to write the data at the write memory addresses of memory devices 1508a-1508n.

Processor 1502 can fetch software instructions from instruction memory 1504 and execute the instructions. The instructions can include an error detection module 1522 to detect data mismatches among memory devices 1508a-1508n. Processor 1502 can also execute software instructions of an error correction module 1524 to correct the corrupted data in one or more of memory devices 1508a-1508n. Processor 1502 can synchronize the error detection and correction operations to a clock signal. For example, error detection module 1522 can transmit a read request to read circuit 1512 periodically to read the data stored in memory devices 1508a-1508n. The duration between each read operation of stored data can be shorter than an average duration between transient upset events (e.g., an average duration between two strikes of ionizing particles 520). Error detection module 1522 can detect a mismatch among the data fetched from the read operation, and identify the corrupted memory address (and the memory device) where the mismatch occurs. Error detection module 1522 can determine the uncorrupted state of the redundant data based on identifying the majority data. Error correction module 1524 can then transmit a write request targeted at the corrupted memory address (or memory addresses of all of memory devices 1508a-1508n) and including the uncorrupted data to write circuit 1514, which can restore the corrupted data at the corrupted memory address back to the uncorrupted state responsive to the write request. Processor 1502 (in executing error correction module 1524 or other software instructions) can also transmit other write requests to write circuit 1514 to store copies of new data at memory devices 1508a-1508n.

Figure 16:
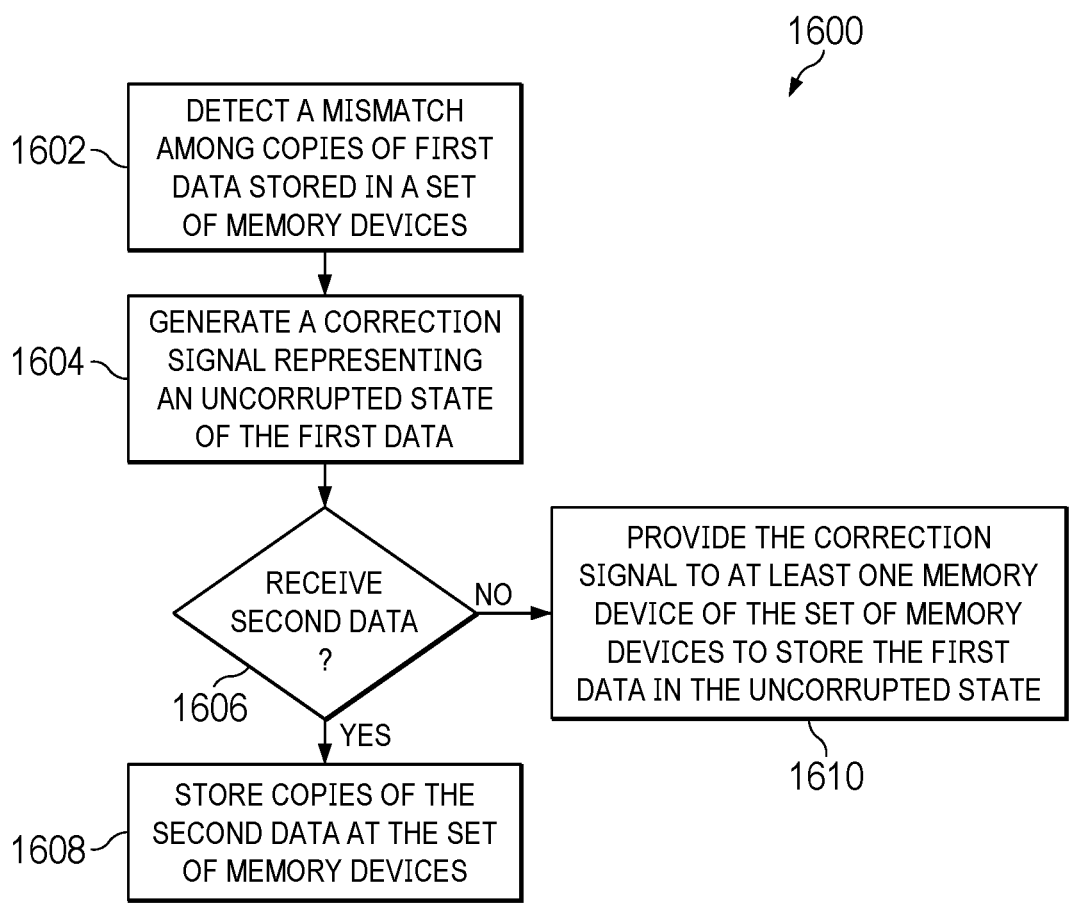
FIG. 16 illustrates a flowchart of a method of operating a redundant data storage system.

FIG. 16 illustrates a flowchart of a method 1600 of operating a redundant data storage system, such as redundant data storage system 900 or system 1500. Method 1600 can be performed by an error detection and correction system, such as error detection circuit 902 and error correction circuit 904. Method 1600 can also be performed by a processor (e.g., processor 1502) that executes a set of instructions to implement the error detection and correction system. The redundant data storage system can include a set of memory devices configured to store copies of the same data. The set of memory devices can include sequential logic circuits (e.g., R-S latches and flip-flops) and RAM (e.g., SRAM, DRAM, and MRAM).

In step 1602, the error detection and correction system (e.g., error detection circuit 902, error detection module 1522) can detect a data mismatch among copies of first data stored in the set of memory devices which, if uncorrupted, can output the same first data. In some examples, the detection of data mismatch can be performed asynchronously by a logic circuit, such as a logical AND gate of FIGS. 11, 13, and 14. In some examples, the detection of data mismatch can be performed synchronously by a processor, such as processor 1502 of FIG. 15. The processor can implement the error detection module to read the first data stored in the set of memory devices periodically responsive to a clock signal. The duration between each read operation of stored data can be shorter than an average duration between transient upset events (e.g., an average duration between two strikes of ionizing particles 520). After reading the first data from the set of memory devices, the error detection module can process the data to detect a data mismatch among the first data fetched from the set of memory devices, and identify the address of the memory device that stores the corrupted data.

In step 1604, the error detection and correction system (e.g., error detection circuit 902, error detection module 1522) can generate a correction signal (e.g., correction signal 910) representing the uncorrupted state of the first data. The system can set the state of the correction signal based on a majority state of the copies of the first data. For example, for an R-S latch, if the majority state of the copies of the first data is a logical one, the system can provide an asserted correction signal as a set signal to the R-S latch. Also, if the majority state of the copies of the first data is a logical zero, the system can provide an asserted correction signal as a reset signal to the R-S latch. Also, for a RAM, the correction signal can be in the form of a write request including the address and the majority data.

In step 1606, the error detection and correction system (e.g., error correction circuit 904, error correction module 1524) can determine whether second data is received. The second data can be received from, for example, redundant data generation circuit 750, or processor 1502.

If second data is received (in step 1606), the error detection and correction system can proceed to step 1608 and store copies of the second data (e.g., a logical one, a logical zero, or a collection of logical ones and zeros) at the second memory devices. For example, error correction circuit 904 can provide a set signal or a reset signal to store the second data at an R-S latch or a flip-flop. Error correction module 1524 can also provide a write request including the addresses of each memory device and the second data to memory controller 1506, which can store copies of the second data at the set of memory devices.

Also, if second data is not received, the error detection and correction system can proceed to step 1610 and provide the correction signal to at least one memory device of the set of memory devices to store the first data in the uncorrupted state. For example, error correction circuit 904 can provide the correction signal as a set signal or a reset signal to restore the data stored at an R-S latch or a flip-flop back to the uncorrupted state. Error correction module 1524 can also provide a write request including the majority data and the address of the corrupted memory device (or the addresses of all of the memory devices) to memory controller 1506, which can write the uncorrupted data back to that memory device or to all of the memory devices.

Any of the methods described herein may be totally or partially performed with a computing system including one or more processors, which can be configured to perform the steps. Thus, embodiments can be directed to computing systems configured to perform the steps of any of the methods described herein, potentially with different components performing a respective steps or a respective group of steps. Although presented as numbered steps, steps of methods herein can be performed at a same time or in a different order. Additionally, portions of these steps may be used with portions of other steps from other methods. Also, all or portions of a step may be optional. Additionally, any of the steps of any of the methods can be performed with modules, units, circuits, or other means for performing these steps.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described herein as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

Certain components may be described herein as being of a particular process technology, but these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor.

Uses of the phrase "ground voltage potential" in this description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described examples, and other examples are possible, within the scope of the claims.

What is claimed is:

1. An apparatus comprising:
   a first memory device having a first data input and a first data output;
   a second memory device having a second data input and a second data output;
   a third memory device having a third data input and a third data output;
   an error detection circuit having a first detection input, a second detection input, a third detection input, and a detection output, the first detection input coupled to the first data output, the second detection input coupled to the second data output, and the third detection input coupled to the third data output, the error detection circuit configured to:
      detect a mismatch among data stored at the first, second, and third memory devices; and
      responsive to detecting the mismatch, provide a correction signal at the detection output, the correction signal representing a majority state of the data; and
   an error correction circuit having a correction input, a first correction output, a second correction output, and a third correction output, the correction input coupled to the detection output, the first correction output coupled to the first data input, the second correction output coupled to the second data input, the third correction output coupled to the third data input, and the error correction circuit configured to write the majority state of the data into at least one of the first, second, or third memory devices.

2. The apparatus of claim 1, wherein the data is first data, the error correction circuit has an external data input, and the error detection circuit is configured to provide a first data signal at the first, second, and third correction outputs to write second data to each of the first, second, and third memory devices responsive to a second data signal at the external data input.

3. The apparatus of claim 1, further comprising a filter having a filter input and a filter output, the filter input coupled to the detection output, and the filter output coupled to the correction input.

4. The apparatus of claim 3, wherein the filter includes a resistor coupled between the filter input and the filter output, and a capacitor coupled to the filter output.

5. The apparatus of claim 4, wherein the filter includes a buffer circuit coupled between the resistor and the filter output.

6. The apparatus of claim 5, wherein the buffer circuit includes a Schmitt trigger circuit.

7. The apparatus of claim 3, wherein the filter includes:
a sampling circuit having a sampling input and a sampling output, the sampling input coupled to the filter input, the sampling circuit configured to provide samples of a state of the filter input at the sampling output; and
a digital signal processor having a processing input coupled to the sampling output and a processing output coupled to the filter output, the digital processing circuit configured to generate the correction signal at the processing output based on averaging the samples.

8. The apparatus of claim 1, further comprising a majority state determination circuit having first, second, and third candidate inputs and a majority output, the first candidate input coupled to the first data output, the second candidate input coupled to the second data output, and the third candidate input coupled to the third data output, the majority state determination circuit configured to set a state of the majority output responsive to a majority state of the first, second, and third candidate inputs.

9. The apparatus of claim 1, wherein:
the first memory device includes a first sequential logic circuit having a first set input, a first reset input, a first non-inverting output, and a first inverting output, the first set and reset inputs coupled to the first data input, and the first non-inverting and inverting outputs coupled to the first data output;
the second memory device includes a second sequential logic circuit having a second set input, a second reset input, a second non-inverting output, and a second inverting output, the second set and reset inputs coupled to the second data input, and the second non-inverting and inverting outputs coupled to the second data output; and
the third memory device includes a third sequential logic circuit having a third set input, a third reset input, a third non-inverting output, and a third inverting output, the third set and reset inputs coupled to the third data input, and the third non-inverting and inverting outputs coupled to the third data output.

10. The apparatus of claim 9, wherein each of the first, second, and third sequential logic circuits includes an R-S latch.

11. The apparatus of claim 9, wherein:
the first sequential logic circuit includes a first flip-flop having a first clock terminal and a first reset terminal, the first clock terminal coupled to the first set input, and the first reset terminal coupled to the first reset input;
the second sequential logic circuit includes a second flip-flop having a second clock terminal and a second reset terminal, the second clock terminal coupled to the second set input, and the second reset terminal coupled to the second reset input; and
the third sequential logic circuit includes a third flip-flop having a third clock terminal and a third reset terminal, the third clock terminal coupled to the third set input, and the third reset terminal coupled to the third reset input.

12. The apparatus of claim 9, wherein the error detection circuit includes:
a first error detection subcircuit having first detection sub-inputs and a first detection sub-output, the first detection sub-inputs coupled to the first inverting output, the second non-inverting output, and the third non-inverting output via the first detection input, and the first detection sub-output coupled to the detection output;
a second error detection subcircuit having second detection sub-inputs and a second detection sub-output, the second detection sub-inputs coupled to the first non-inverting output, the second inverting output, and the third inverting output via the first detection input, and the second detection sub-output coupled to the detection output;
a third error detection subcircuit having third detection sub-inputs and a third detection sub-output, the third detection sub-inputs coupled to the first non-inverting output, the second inverting output, and the third inverting output via the second detection input, and the third detection sub-output coupled to the detection output;
a fourth error detection subcircuit having fourth detection sub-inputs and a fourth detection sub-output, the fourth detection sub-inputs coupled to the first inverting output, the second non-inverting output, and the third inverting output via the second detection input, and the fourth detection sub-output coupled to the detection output;
a fifth error detection subcircuit having fifth detection sub-inputs and a fifth detection sub-output, the fifth detection sub-inputs coupled to the first non-inverting output, the second non-inverting output, and the third inverting output via the third detection input, and the fifth detection sub-output coupled to the detection output; and
a sixth error detection subcircuit having sixth detection sub-inputs and a sixth detection sub-output, the sixth detection sub-inputs coupled to the first inverting output, the second inverting output, and the third non-inverting output via the third detection input, and the sixth detection sub-output coupled to the detection output.

13. The apparatus of claim 12, wherein each of the first through sixth error detection subcircuits includes an AND gate.

14. The apparatus of claim 12, wherein the error correction circuit includes:
a first correction subcircuit having a first external data input, a first correction sub-input, and a first correction sub-output, the first correction sub-input coupled to the first detection sub-output via the correction input, and the first correction sub-output coupled to the first set input via the first correction output;
a second correction subcircuit having a second external data input, a second correction sub-input, and a second correction sub-output, the second correction sub-input coupled to the second detection sub-output via the correction input, and the second correction sub-output coupled to the first reset input via the first correction output;
a third correction subcircuit having a third external data input, a third correction sub-input, and a third correction sub-output, the third correction sub-input coupled to the third detection sub-output via the correction input, and the third correction sub-output coupled to the second set input via the second correction output;
a fourth correction subcircuit having a fourth external data input, a fourth correction sub-input, and a fourth correction sub-output, the fourth correction sub-input coupled to the fourth detection sub-output via the correction input, and the fourth correction sub-output coupled to the second reset input via the second correction output;

a fifth correction subcircuit having a fifth external data input, a fifth correction sub-input, and a fifth correction sub-output, the fifth correction sub-input coupled to the fifth detection sub-output via the correction input, and the fifth correction sub-output coupled to the third set input via the third correction output; and a sixth correction subcircuit having a sixth external data input, a sixth correction sub-input, and a sixth correction sub-output, the sixth correction sub-input coupled to the sixth detection sub-output via the correction input, and the sixth correction sub-output coupled to the third reset input via the third correction output.

15. The apparatus of claim 14, wherein each of the first through sixth correction subcircuit includes an OR gate or a NOR gate.

16. The apparatus of claim 1, wherein each of the first, second, and third memory devices includes a random access memory (RAM) device.

17. The apparatus of claim 1, wherein the error detection circuit is configured to detect the mismatch responsive to a change in a state of at least one of first, second, or third detection inputs.

18. The apparatus of claim 1, wherein the error detection circuit is configured to, responsive to a clock signal:
determine a respective state of each of the first, second, and third detection inputs; and
detect the mismatch from the respective states.

19. An apparatus comprising:
a first memory device configured to store a first copy of first data;
a second memory device configured to store a second copy of the first data;
a third memory device configured to store a third copy of the first data;
an instruction memory configured to store a set of instructions; and
a processor configured to execute the set of instructions to:
detect a mismatch between the first, second, and third copies of the first data stored at the respective first, second, and third memory devices;
generate a correction signal representing an uncorrupted state of the first data;
determine whether second data is received;
responsive to determining that the second data is received, store copies of the second data at the first, second, and third memory devices; and
responsive to determining that the second data is not received, provide the correction signal to at least one of the first, second, or third memory devices to write the uncorrupted state of the first data into at least one of the first, second, or third memory devices.

20. A method comprising:
detecting a mismatch among copies of first data stored in a set of memory devices;
generating a correction signal representing an uncorrupted state of the first data;
determining whether second data is received;
responsive to determining that the second data is received, writing copies of the second data into the set of memory devices; and
responsive to determining that the second data is not received, providing the correction signal to at least one memory device of the set of memory devices to write the uncorrupted state of the first data into the at least one memory device.

* * * * *